(12) United States Patent
Sakai et al.

(10) Patent No.: US 7,741,677 B2
(45) Date of Patent: Jun. 22, 2010

(54) SEMICONDUCTOR INTEGRATED CIRCUIT DEVICE AND MANUFACTURING METHOD THEREOF

(75) Inventors: Satoshi Sakai, Yokohama (JP); Atsushi Hiraiwa, Higashimurayama (JP); Satoshi Yamamoto, Takarazuka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/486,944

(22) Filed: Jun. 18, 2009

(65) Prior Publication Data

US 2009/0273037 A1 Nov. 5, 2009

Related U.S. Application Data

(63) Continuation of application No. 11/963,846, filed on Dec. 23, 2007, now Pat. No. 7,560,772, which is a continuation of application No. 10/496,825, filed as application No. PCT/JP01/10492 on Nov. 20, 2001, now Pat. No. 7,335,561.

(51) Int. Cl.
  *H01L 29/76* (2006.01)
  *H01L 29/94* (2006.01)
  *H01L 31/113* (2006.01)

(52) U.S. Cl. ............................ 257/336; 257/E21.001; 257/E21.193

(58) Field of Classification Search ................. 257/336, 257/E21.001, E21.068, E21.193
See application file for complete search history.

(56) References Cited

U.S. PATENT DOCUMENTS

| 4,477,310 A | 10/1984 | Park et al. |
| 4,651,406 A | 3/1987 | Shimizu et al. |
| 5,162,884 A | 11/1992 | Liou et al. |
| 5,241,208 A | 8/1993 | Taguchi |
| 5,723,355 A | 3/1998 | Chang et al. |
| 6,043,128 A | 3/2000 | Kamiya |
| 6,262,455 B1 | 7/2001 | Lutze et al. |
| 6,376,316 B2 | 4/2002 | Shukuri et al. |
| 6,489,648 B2 | 12/2002 | Iwasaki et al. |
| 6,559,012 B2 | 5/2003 | Shukuri et al. |
| 6,602,751 B2 | 8/2003 | Oohashi |
| 6,727,146 B2 | 4/2004 | Murakami et al. |
| 6,734,114 B2 | 5/2004 | Hinoue et al. |
| 6,737,341 B1 | 5/2004 | Yamamoto et al. |
| 6,759,706 B2 | 7/2004 | Kobayashi |
| 6,784,508 B2 | 8/2004 | Tsunashima et al. |
| 6,787,451 B2 | 9/2004 | Shimamoto et al. |
| 2001/0016388 A1 | 8/2001 | Koyama et al. |
| 2003/0003639 A1 | 1/2003 | Kanda et al. |

FOREIGN PATENT DOCUMENTS

| JP | 4-122063 | 4/1992 |
| JP | 6-222387 | 8/1994 |

(Continued)

*Primary Examiner*—David S Blum
(74) *Attorney, Agent, or Firm*—Miles & Stockbridge P.C.

(57) ABSTRACT

After silicon oxide film (9) is formed on the surface of a semiconductor substrate (1), the silicon oxide film (9) in a region in which a gate insulation film having a small effective thickness is formed is removed using diluted HF and after that, high dielectric constant insulation film (10) is formed on the semiconductor substrate (1). Consequently, two kinds of gate insulation films, namely, a gate insulation film (12) comprised of stacked film of high dielectric constant insulation film (10) and silicon oxide film (9) and gate insulation film (11) comprised of the high dielectric constant insulation film (10) are formed on the semiconductor substrate (1).

20 Claims, 43 Drawing Sheets

FOREIGN PATENT DOCUMENTS

| | | |
|---|---|---|
| JP | 8-250742 | 9/1996 |
| JP | 11-204654 | 7/1999 |
| JP | 2001-15612 | 1/2001 |
| JP | 2001-284463 | 10/2001 |
| JP | 2001-298085 | 10/2001 |

US 7,741,677 B2

SEMICONDUCTOR INTEGRATED CIRCUIT DEVICE AND MANUFACTURING METHOD THEREOF

CROSS-REFERENCE TO RELATED APPLICATION

This application is a continuation of application Ser. No. 11/963,846, filed Dec. 23, 2008, now U.S. Pat. No. 7,560,772 which is a continuation of application Ser. No. 10/496,825 filed Oct. 13, 2004, now U.S. Pat. No. 7,335,561, which is a 371 of PCT/JP01/10492 filed Nov. 20, 2001.

TECHNICAL FIELD

The present invention relates to a manufacturing technology of semiconductor integrated circuit device and more particularly to a technology effectively applicable for semiconductor integrated circuit device incorporating plural kinds of MISs (metal insulator semiconductor) each having a different thickness of gate insulation film.

BACKGROUND ART

To achieve high integration and reduction of power of the semiconductor integrated circuit device, the operating voltage of the semiconductor device has been reduced as the generation advances. At this time, to maintain and improve device performance, the MIS transistor has been miniaturized according to the scaling rule and its gate insulation film has been reduced in size. On the other hand, to reduce power consumption, maintain memory information or correspond to an external power supply voltage, a MIS transistor having a relatively thick gate insulation film has been required. For example, because the operating voltage differs between its internal circuit and I/O circuit in case of LSI (large scale integrated circuit) or CMOS (complementary metal oxide semiconductor) logical LSI, plural kinds of MIS transistors whose gate insulation film differs in thickness are formed on the same substrate.

Japanese Patent Application Laid-Open No. 2001-15612 has disclosed a technology that two kinds of silicon oxide films each having a different thickness are formed on the same substrate so as to serve as MIS transistor gate insulation film.

In a MIS transistor whose gate electrode width (hereinafter referred to as gate length) is less than 0.1 µm, it is expected that the thickness of the gate insulation film is less than 1.2 nm. However, if the silicon oxide film, which has been conventionally used as a gate insulation film, is formed in the thickness of less than 1.2 nm, there occurs a problem that leakage current exceeds 10 A/cm$^2$, so that for example standby current increases.

Thus, a trial for reducing an effective thickness with physical film thickness maintained at 2 nm or more has been made by using an insulation film whose dielectric constant is relatively high (hereinafter referred to as high dielectric constant film), for example, alumina film ($Al_2O_3$) whose dielectric constant is about 7 as a gate insulation film. The effective thickness means silicon oxide ($SiO_2$) converted film thickness considering dielectric constant.

The present inventors considered a technology for forming two kinds of MIS transistors comprised of each gate insulation film by employing a high dielectric-constant insulation film on two kinds of gate insulation films each having a different thickness. The following is the technology considered by the present inventors and it is summarized as below.

First, a first high dielectric constant insulation film is formed on a substrate and after that, the first high dielectric constant insulation film is removed with a resist film as a mask. Next, after the resist film is removed, washing processing is carried out on the substrate and a second high dielectric constant insulation film is formed on the substrate. Consequently, a thin gate insulation film is formed of the second high dielectric constant insulation film in the first region so that a thick gate insulation film is formed of the first and second high dielectric constant insulation films in a second region different from the first region. By forming gate, source, drain and wiring, a MIS transistor having the thin gate insulation film is formed in the first region and a MIS transistor having a thick insulation film is formed in the second region.

However, it is made evident that the fabrication method of the MIS transistor has following problems.

(1) When a difference in level of 20 nm or more is formed between the first region and the second region due to a difference in thickness of the gate insulation film, a trouble occurs in forming step for the gate and forming step for an opening used for passing wiring.

(2) A high selectivity to the substrate and resist film is possessed and new etching technology for a high dielectric constant insulation film free of etching damage and pollution to a substrate needs to be developed.

An object of the present invention is to provide a technology for forming a gate insulation film having a high reliability and at the same time, facilitating manufacturing of a MIS transistor in a semiconductor integrated circuit device containing plural kinds of the MIS transistors each having a different thickness of gate insulation film.

The aforementioned and other objects and novel features of the present invention will be apparent from a description of this specification and accompanying drawings.

DISCLOSURE OF THE INVENTION

The typical ones of the inventions disclosed in this application will be briefly described as follows.

A semiconductor integrated circuit device of the present invention comprising: a semiconductor substrate; a first MIS transistor including a pair of first semiconductor regions formed in the semiconductor substrate and a first conductive piece formed above the semiconductor substrate through a first gate insulation film in a region between the pair of the first semiconductor regions; and a second MIS transistor including a pair of second semiconductor regions formed in the semiconductor substrate and a second conductive piece formed above the semiconductor substrate through a second gate insulation film in a region between the pair of the second semiconductor regions, wherein the thickness of the first gate insulation film is larger than the thickness of the second gate insulation film and the first gate insulation film is comprised of the first insulation film located on the semiconductor substrate and the second insulation film located on the first insulation film; and wherein the second gate insulation film is comprised of a third insulation film located on the semiconductor substrate and the dielectric constant of the second and third insulation films is larger than the dielectric constant of the first insulation film.

A manufacturing method of semiconductor integrated circuit device of the present invention comprises the steps of: forming a first insulation film on the surface of the semiconductor substrate in a first region of the semiconductor substrate and a second region different from the first region; selectively removing the first insulation film in the second region with the first insulation film in the first region being left; forming a second insulation film on the first insulation film in the first region and on the semiconductor substrate in the second region; forming a first conductive layer on the second insulation film; forming a first conductive piece in the first region and a second conductive piece in the second region by patterning the first conductive layer; introducing a first impurity of first conductive type so as to form the first semiconductor region on the surface of the semiconductor substrate on both sides of each of the first and second conductive pieces; forming a third insulation film on the first and second conductive pieces and side walls; forming a first side wall insulation film on the side wall of the first conductive piece and a second side wall insulation film on the side wall of the second conductive piece by anisotropic etching the third insulation film; and introducing a second impurity of first conductive type so as to form a second semiconductor region on the surface of the semiconductor substrate on both sides of the first and second side wall insulation films.

BEST MODE FOR CARRYING OUT THE INVENTION

Figure 1:
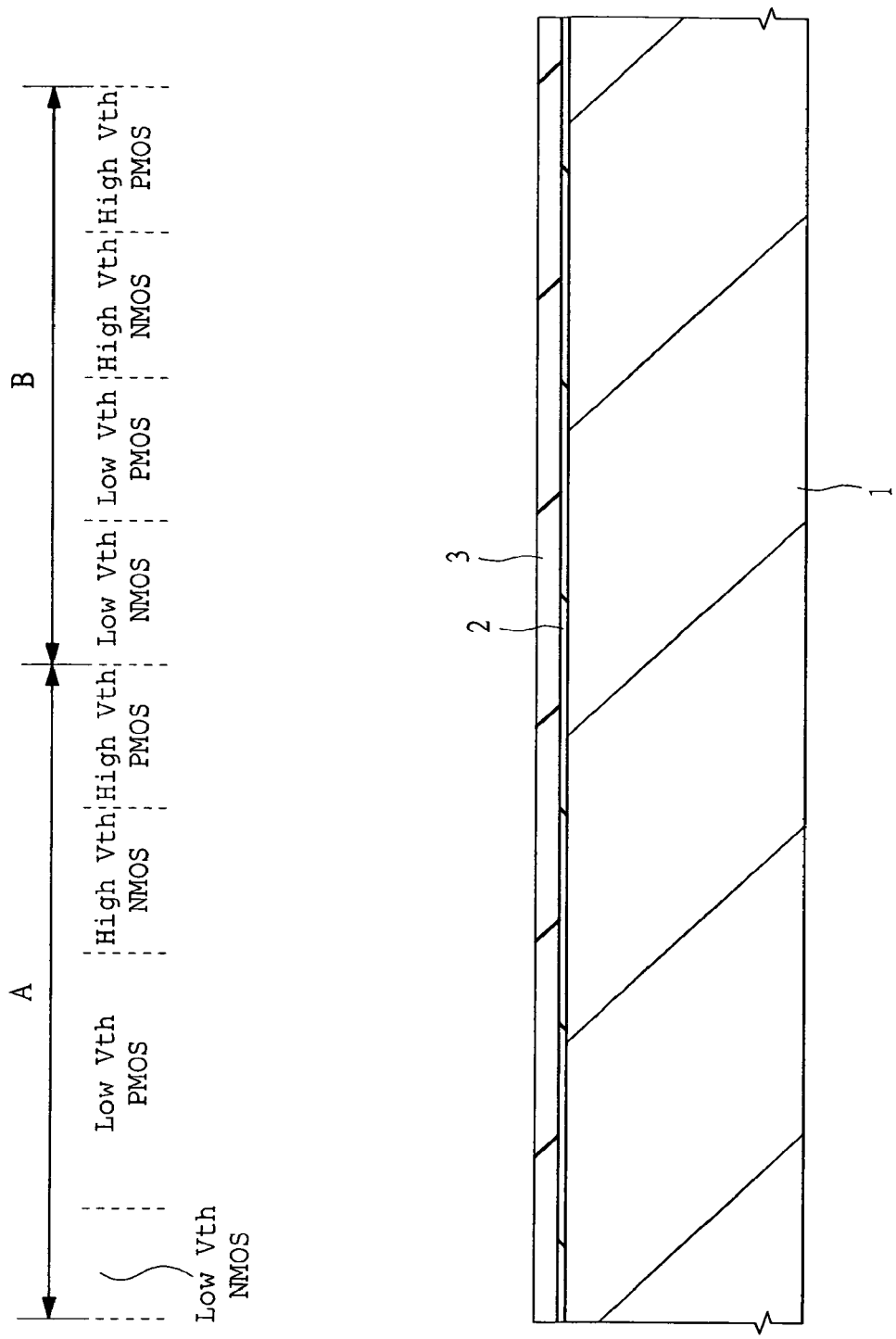
FIG. 1 is a major part sectional view of a semiconductor substrate showing an example of the manufacturing method of a semiconductor integrated circuit according to an embodiment of the present invention in the order of steps.

Hereinafter, an embodiment of the present invention will be described in detail with reference to the accompanying drawing. Like reference numerals are attached to components having the same function in all drawings for explaining the embodiments and repeated description thereof is omitted.

An example of the manufacturing method for the semiconductor integrated circuit device according to an embodiment of the present invention will be described using major part sectional views of the semiconductor substrate shown in FIGS. 1-40. In the Figures, a region A indicates a region in which a gate insulation film having a larger effective thickness is formed and the region B indicates a region in which a gate insulation film having a smaller effective thickness is formed. In the regions A, B, n-channel MIS transistor (hereinafter referred to as low VthNMOS) having a low threshold value voltage (hereinafter referred to as Vth), p-channel MIS transistor (hereinafter referred to as low VthPMOS) having a low Vth, n-channel MIS transistor (hereinafter referred to as high VthNMOS) having a high Vth and p-channel MIS transistor (hereinafter referred to as high Vth PMOS) having a high Vth are formed and that is, eight kinds of the MIS transistors are formed on the same substrate.

First, as shown in FIG. 1, a semiconductor substrate comprised of for example, p-type silicon crystal is prepared. Next, thin silicon oxide film 2 about 0.01 μm is formed by oxidizing this semiconductor substrate 1 thermally and a silicon nitride film 3 about 0.1 μm is deposited according to CVD (chemical vapor deposition) method.

Figure 2:
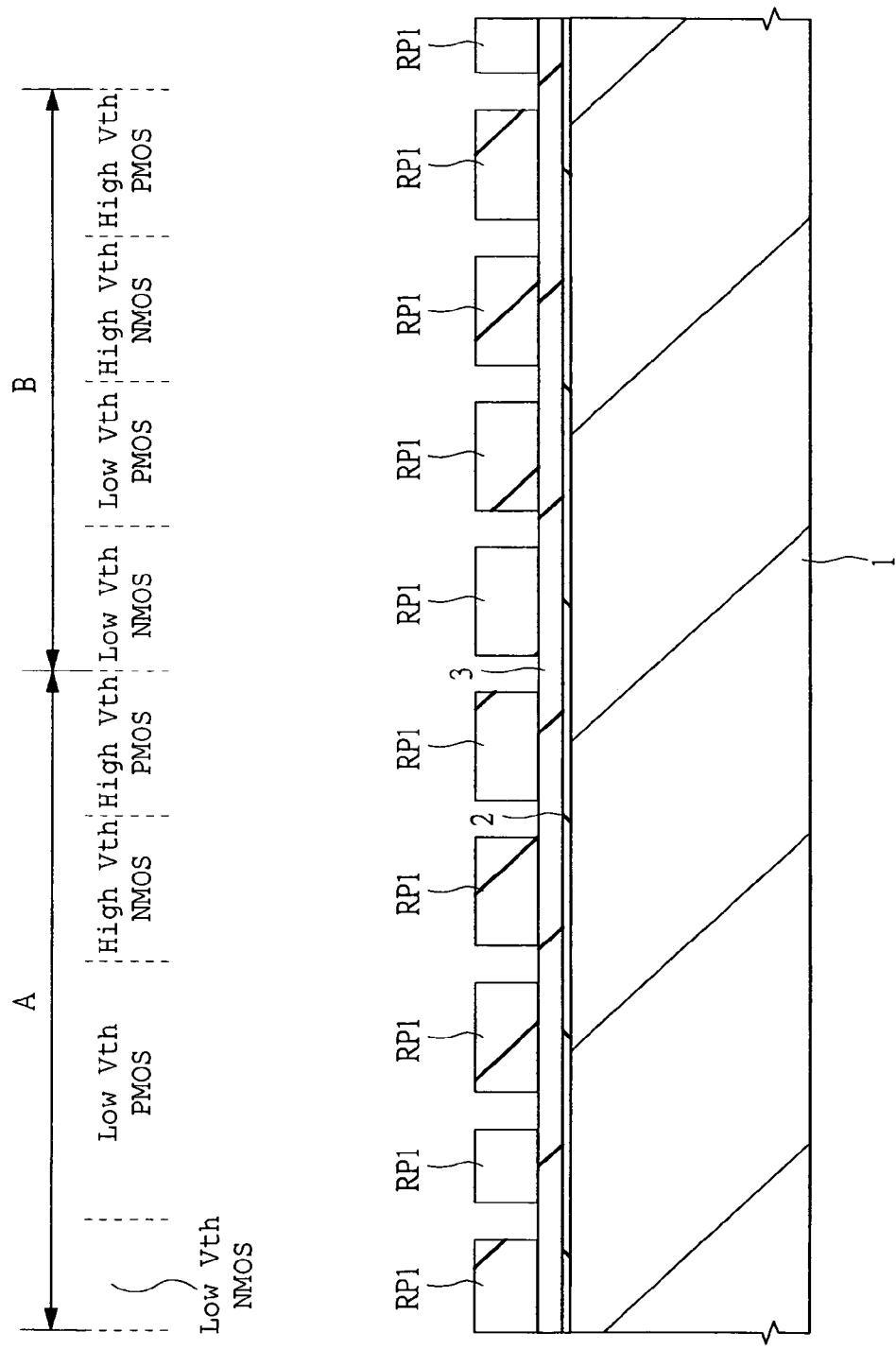
FIG. 2 is a major part sectional view of a semiconductor substrate showing an example of the manufacturing method of a semiconductor integrated circuit according to an embodiment of the present invention in the order of steps.

After that, as shown in FIG. 2, resist pattern RP1 is formed on the silicon nitride film 3. This resist pattern RP can be formed with ordinary photography technology. That is, the resist pattern RP is formed by exposing that photo resist film to light or developing it after the photo resist film is applied to the semiconductor substrate 1.

Figure 3:
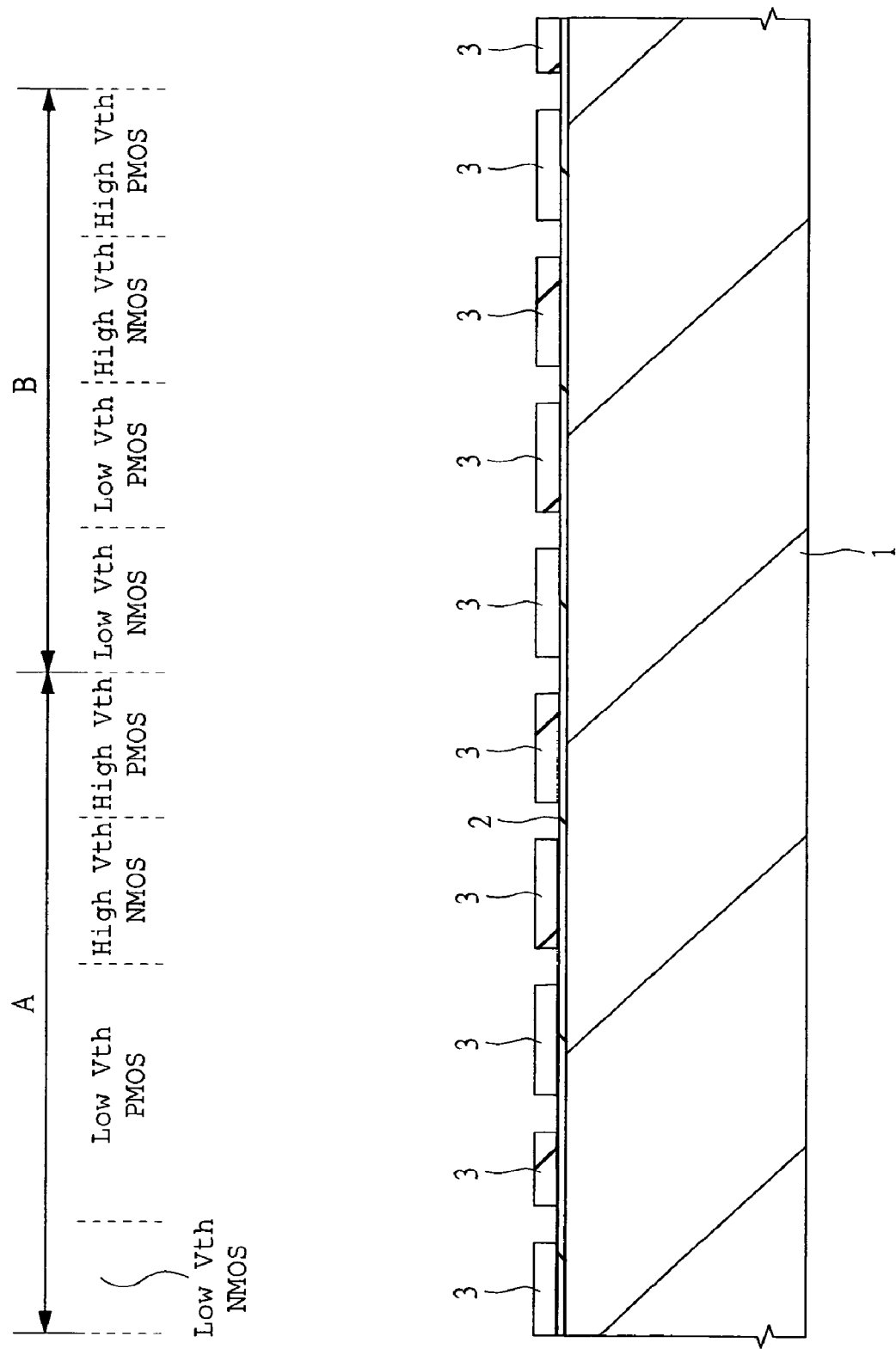
FIG. 3 is a major part sectional view of a semiconductor substrate showing an example of the manufacturing method of a semiconductor integrated circuit according to an embodiment of the present invention in the order of steps.
Figure 4:
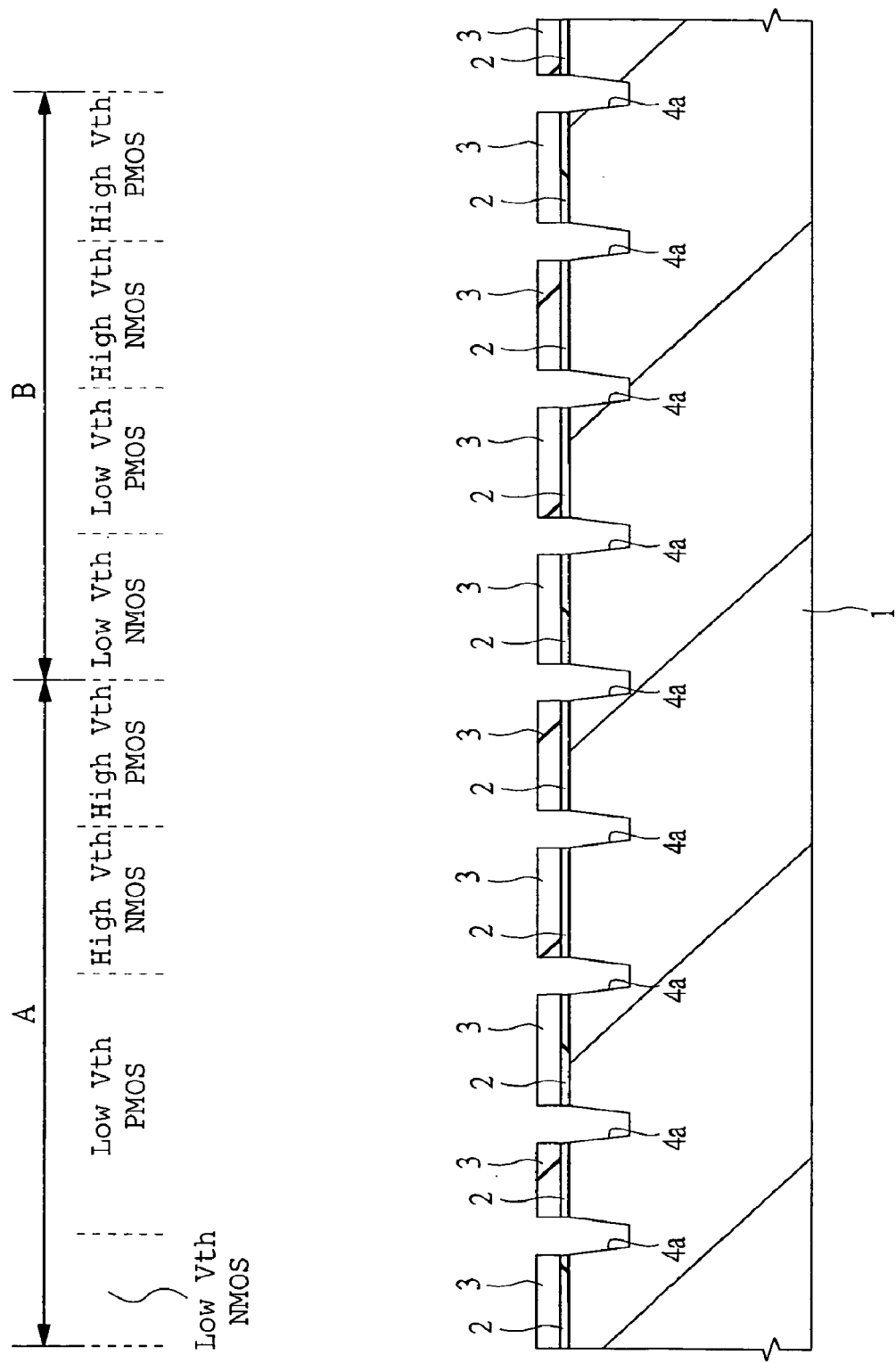
FIG. 4 is a major part sectional view of a semiconductor substrate showing an example of the manufacturing method of a semiconductor integrated circuit according to an embodiment of the present invention in the order of steps.

As shown in FIG. 3, the silicon nitride film 3 is etched with the resist pattern RP1 as a mask and then the resist pattern RP1 is removed. Next, as shown in FIG. 4, the silicon oxide film 2 and the semiconductor substrate 1 are dry-etched with the patterned silicon nitride film 3 so as to form an isolation groove 4a about 0.35 μm deep in the semiconductor substrate 1 in an isolation region.

Figure 5:
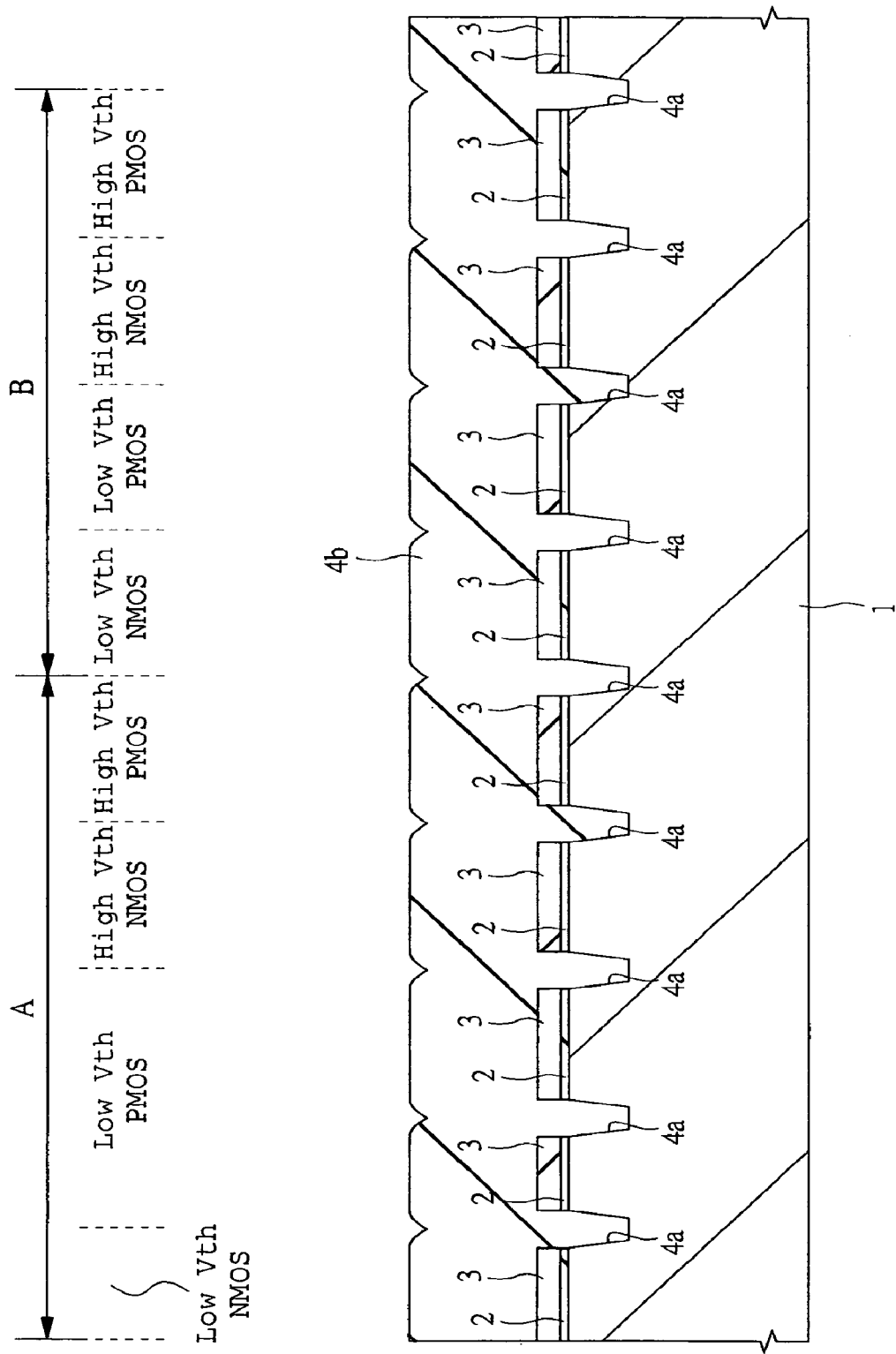
FIG. 5 is a major part sectional view of a semiconductor substrate showing an example of the manufacturing method of a semiconductor integrated circuit according to an embodiment of the present invention in the order of steps.

Next, after silicon oxide film (not shown) is formed by oxidizing the semiconductor substrate 1 thermally, as shown in FIG. 5, silicon oxide film 4b is deposited on the semiconductor substrate 1 according to the CVD method.

Figure 6:
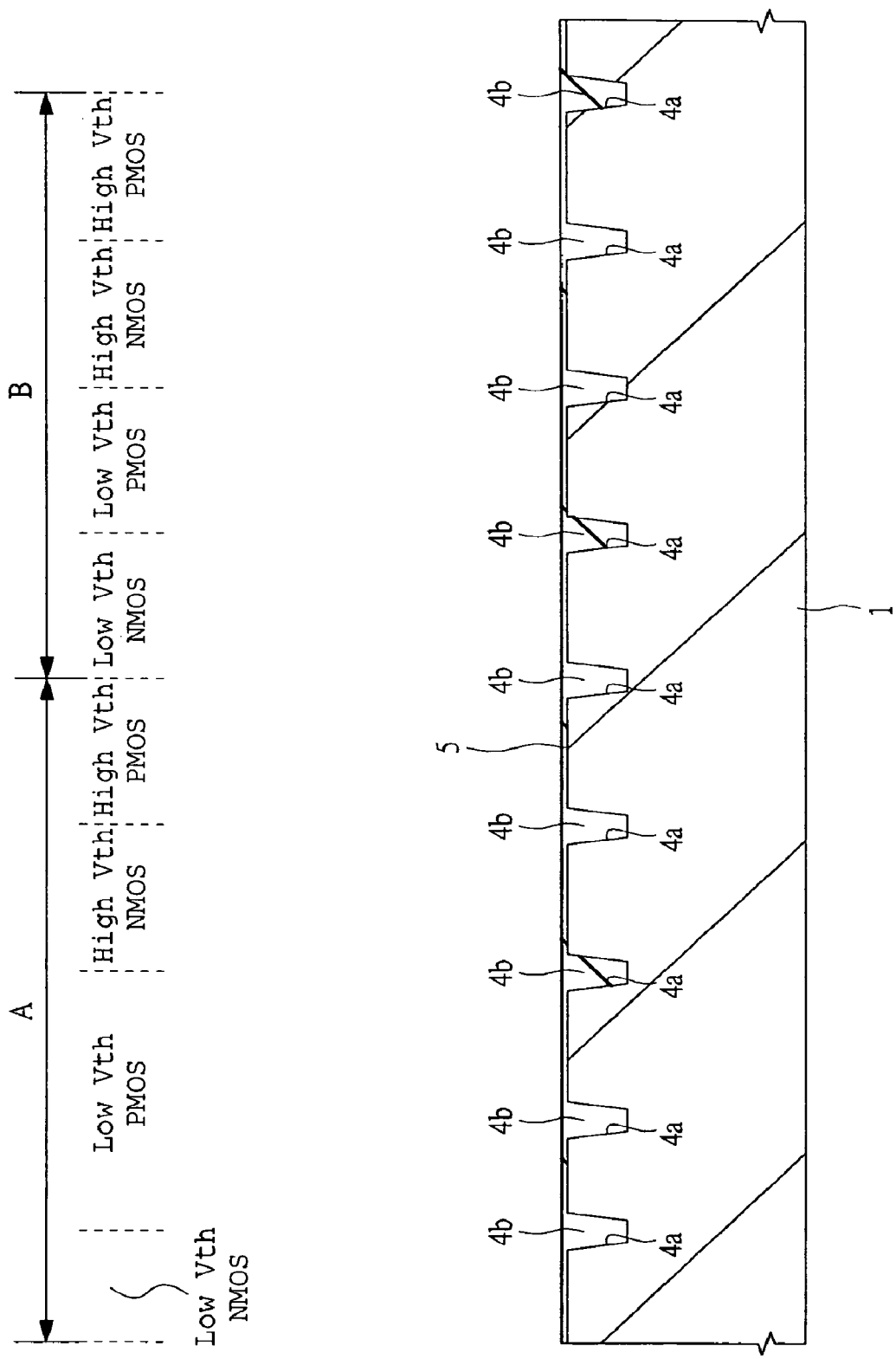
FIG. 6 is a major part sectional view of a semiconductor substrate showing an example of the manufacturing method of a semiconductor integrated circuit according to an embodiment of the present invention in the order of steps.

As shown in FIG. 6, by polishing the silicon oxide film 4b according to the CMP (chemical mechanical polishing) method, the silicon oxide film 4b is left inside the isolation groove 4a to form an isolation region. After that, by conducting heat treatment upon the semiconductor substrate 1 at about 1,000° C., the silicon oxide film 4b embedded in the isolation groove 4a is hardened. Next, the silicon nitride film 3 is removed with heated phosphoric acid and subsequently, the silicon oxide film 2 left on the surface of the semiconductor substrate 1 is removed with diluted HF and a protective film 5 is formed on the surface of the semiconductor substrate 1 by oxidizing the semiconductor substrate 1 thermally.

Figure 7:
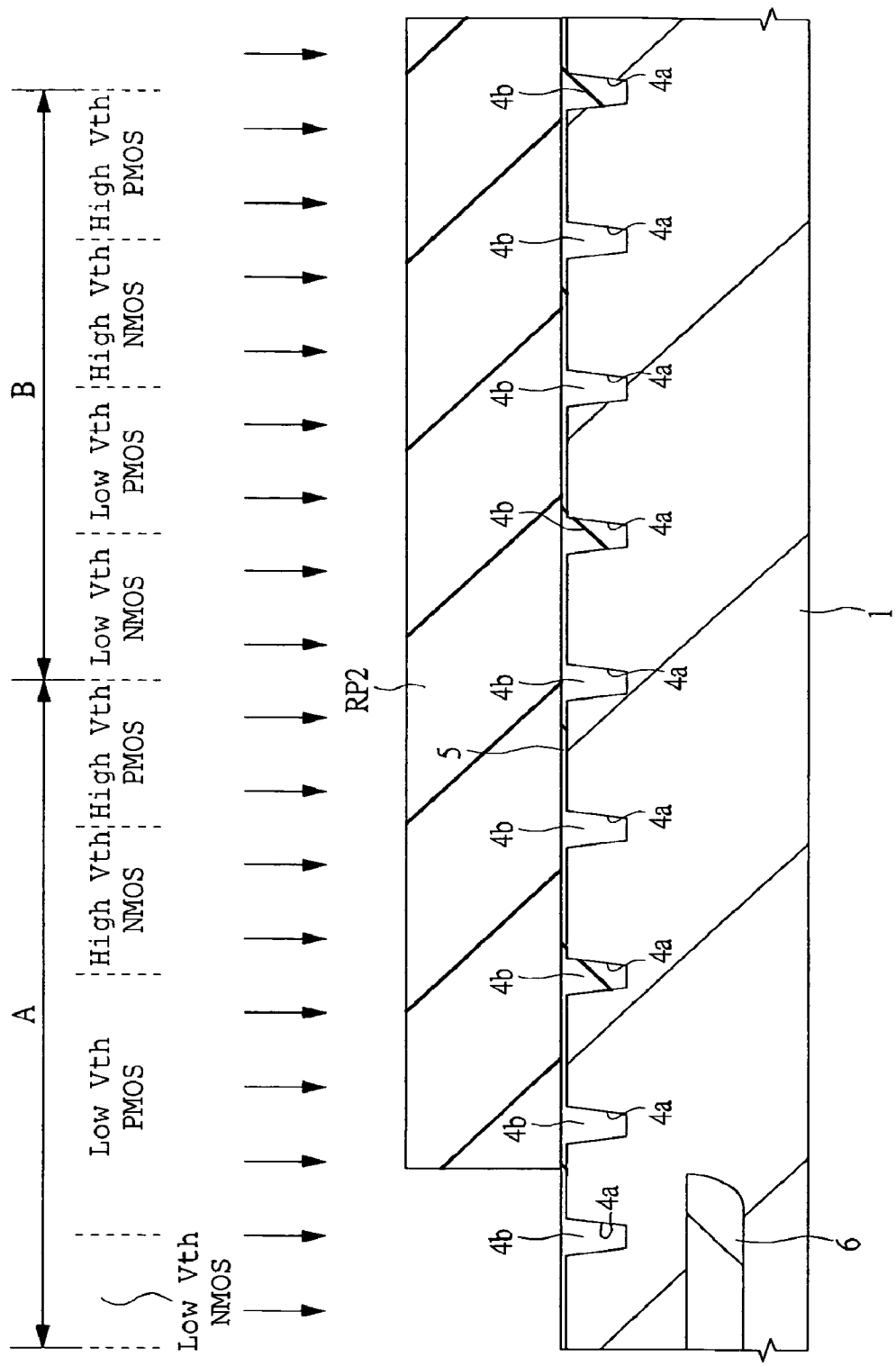
FIG. 7 is a major part sectional view of a semiconductor substrate showing an example of the manufacturing method of a semiconductor integrated circuit according to an embodiment of the present invention in the order of steps.

Next, as shown in FIG. 7, by ion-implanting n-type impurity, for example, phosphorus into the semiconductor substrate 1 with resist pattern RP2 as a mask, deep well 6 is formed. The aforementioned phosphorous is implanted in a condition that the implantation energy is 1-3 MeV and the dose amount is $1\times10^{12}$-$5\times10^{12}$ cm$^{-2}$.

Figure 8:
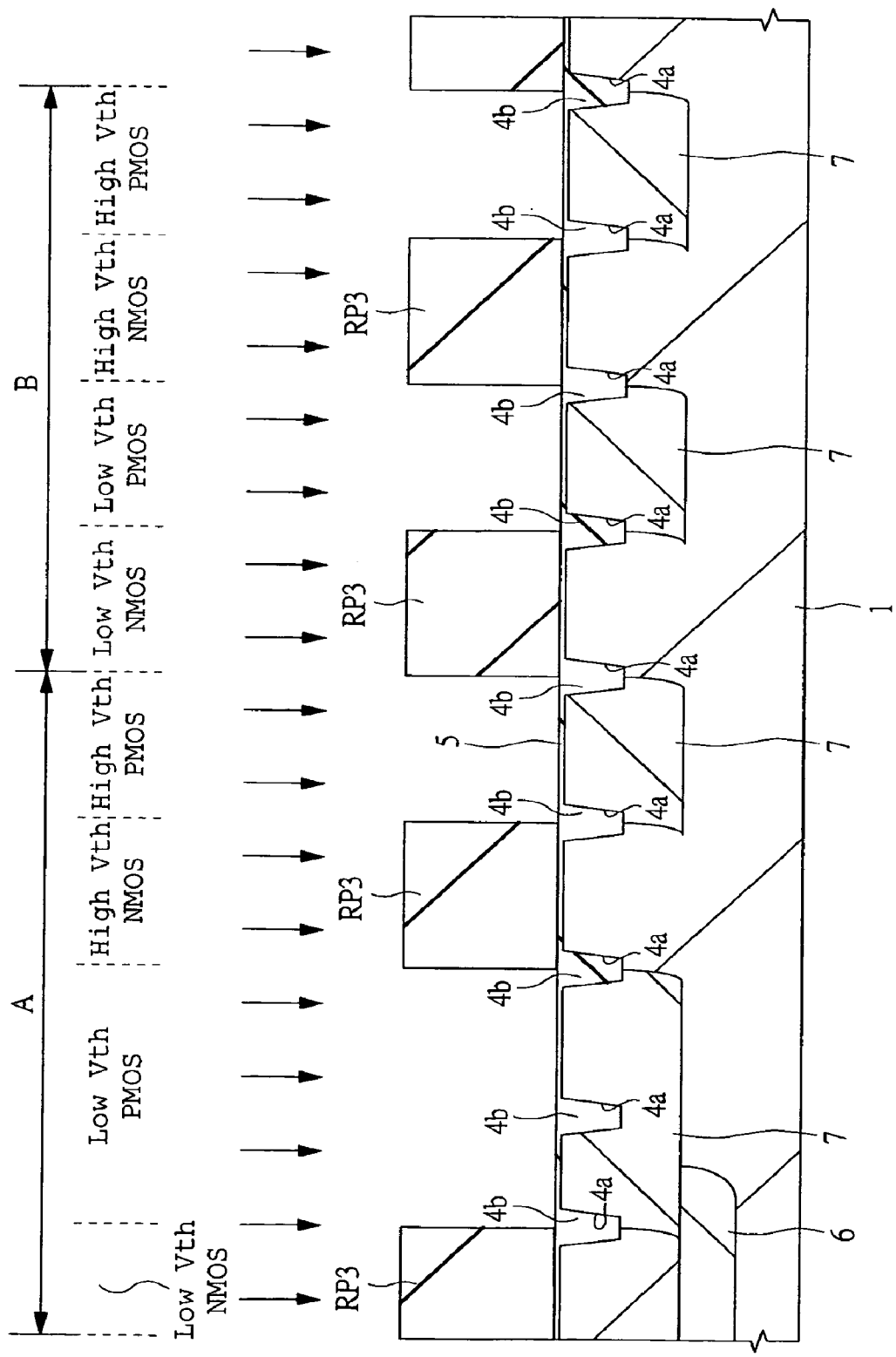
FIG. 8 is a major part sectional view of a semiconductor substrate showing an example of the manufacturing method of a semiconductor integrated circuit according to an embodiment of the present invention in the order of steps.
Figure 9:
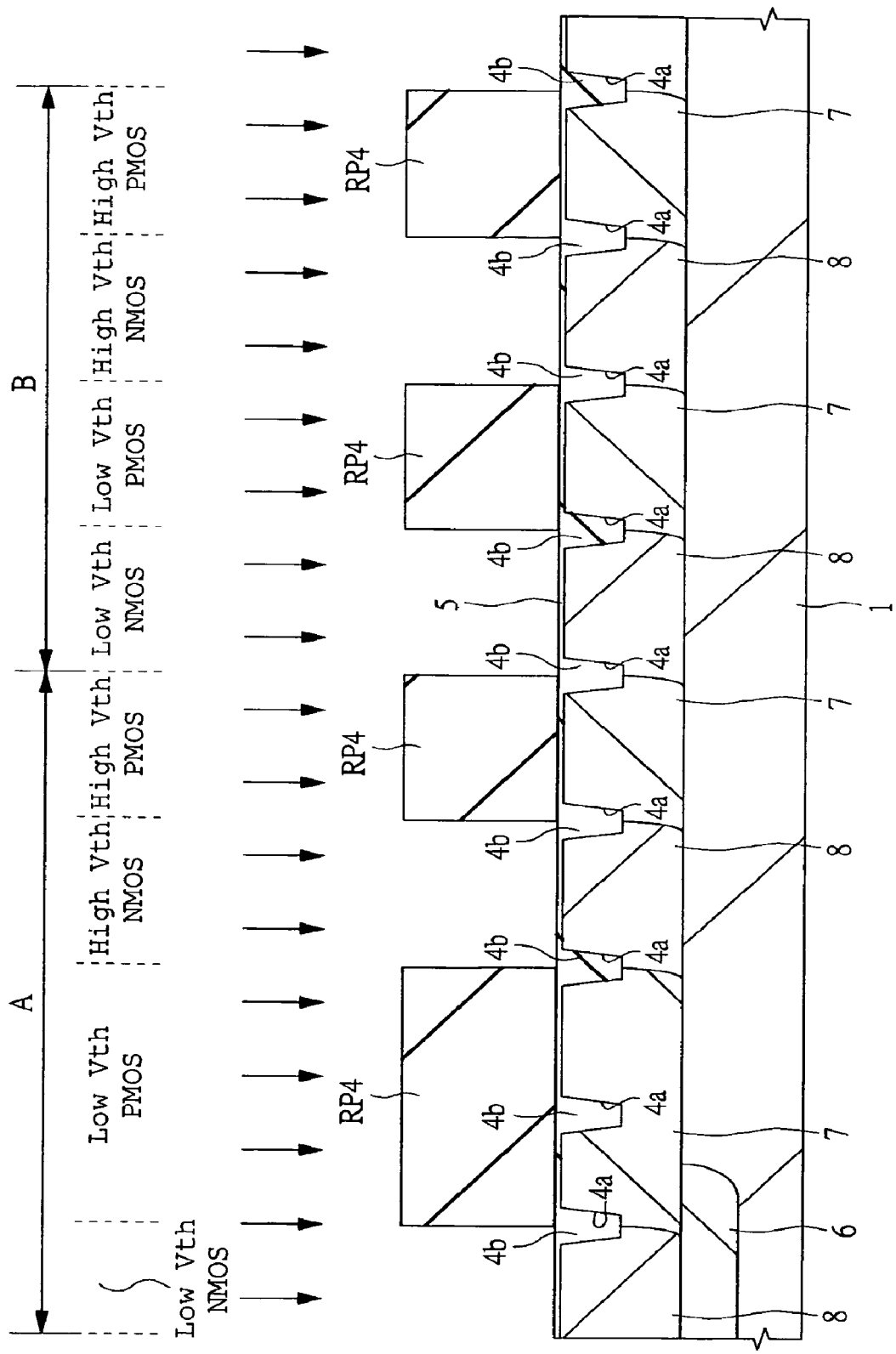
FIG. 9 is a major part sectional view of a semiconductor substrate showing an example of the manufacturing method of a semiconductor integrated circuit according to an embodiment of the present invention in the order of steps.

After the resist pattern RP2 is removed, as shown in FIG. 8, the NMOS formation regions in the regions A, B are covered with resist pattern RP3 and by ion-implanting n-type impurity, for example, phosphorous into the PMOS formation regions in the regions A, B, a n-well 7 is formed. The aforementioned phosphorous is implanted in a condition that the implantation energy is 500 to 100 keV and the dose amount is $5\times10^{11}$ to $5\times10^{12}$ cm$^{-2}$. By ion-implanting twice or three times continuously with changed energy, a retrograde well is formed.

Next, after the resist pattern RP3 is removed, the PMOS formation regions in the regions A, B are covered with pattern RP4 and then, by ion-implanting p-type impurity, for example, boron or boron fluoride into the NMOS formation regions in the regions A, B, n well 8 is formed. The aforementioned boron or boron fluoride is implanted in a condition that the implantation energy is 500 to 100 keV and the dose amount is $5\times10^{11}$ to $5\times10^{12}$ cm$^{-2}$ and retrograde well is formed by ion-implanting twice or three times continuously with changed energy.

Next, after the resist pattern RP4 is removed, impurity for adjusting the Vth of the MIS transistor is ion-implanted into each channel region of the n-well 7 and p-well 8. The ion implantation into the channel region is carried out in the following manner.

Figure 10:
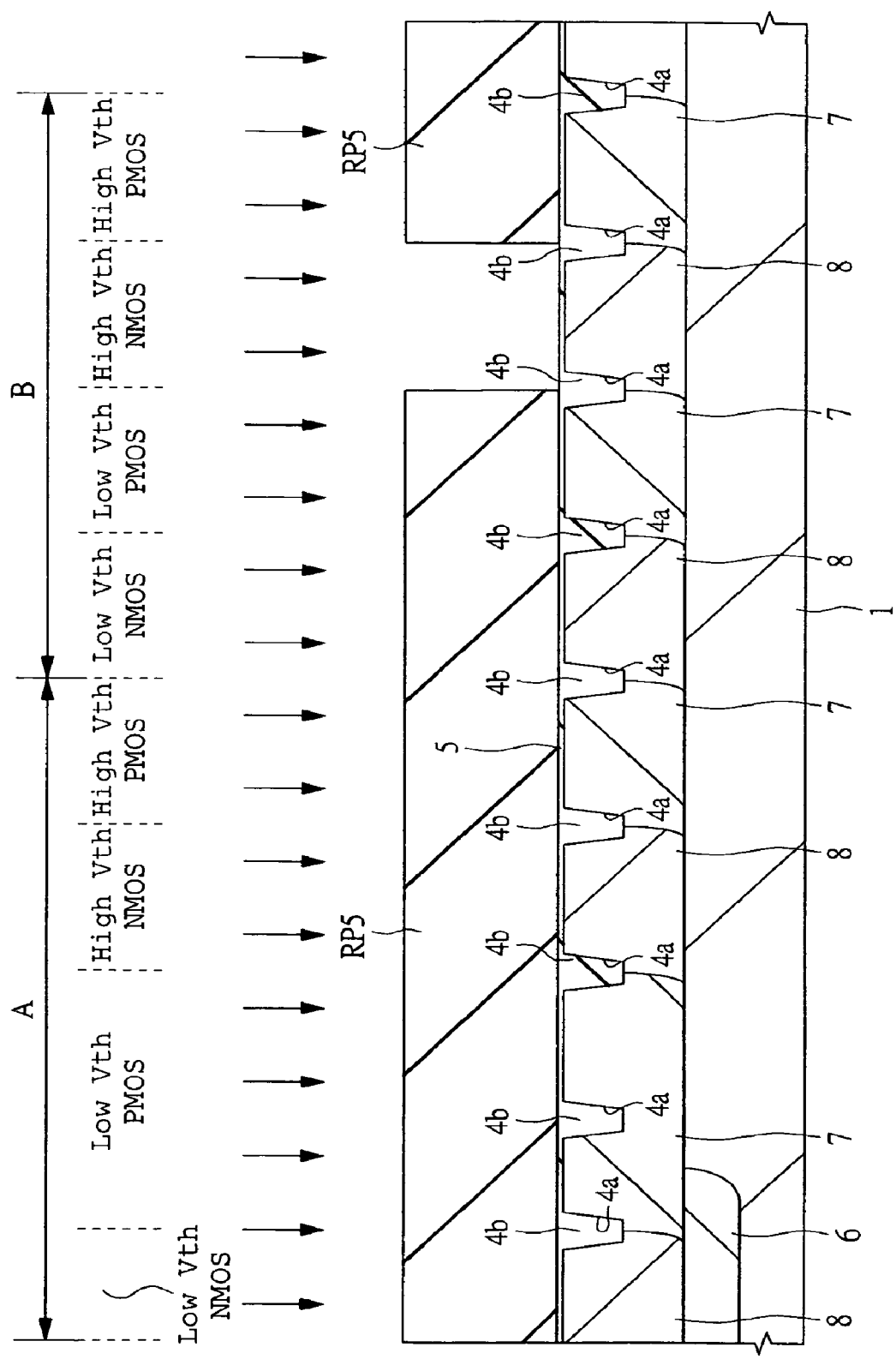
FIG. 10 is a major part sectional view of a semiconductor substrate showing an example of the manufacturing method of a semiconductor integrated circuit according to an embodiment of the present invention in the order of steps.

First as shown in FIG. 10, p-type impurity, for example, boron fluoride is ion-implanted into the channel region of high Vth NMOS formation region in the region B with the resist pattern RP5 as a mask. The aforementioned boron fluoride is implanted in a condition that the implantation energy is 25 keV and the dose amount is $2.5\times10^{13}$ cm$^{-2}$.

Figure 11:
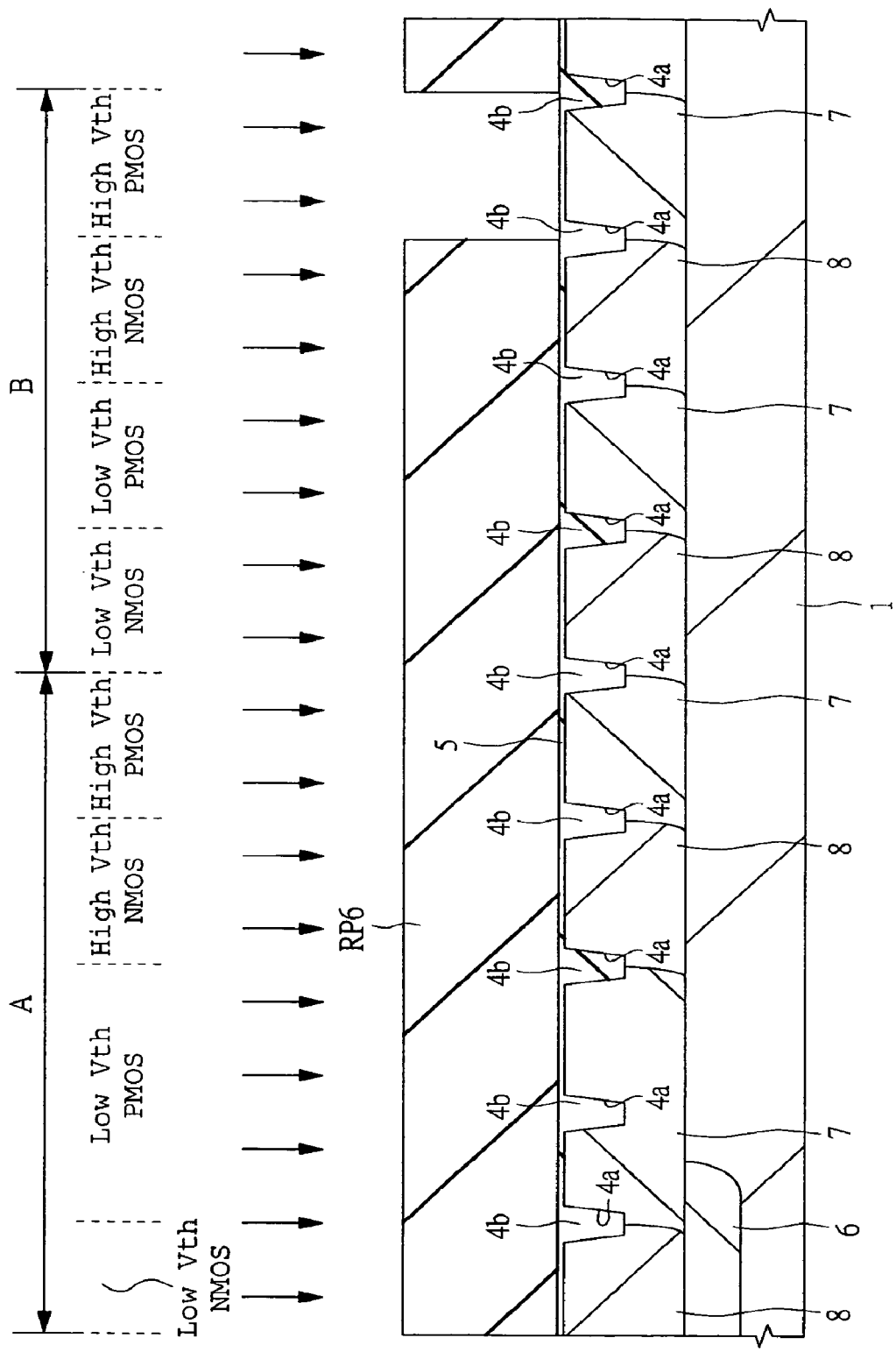
FIG. 11 is a major part sectional view of a semiconductor substrate showing an example of the manufacturing method of a semiconductor integrated circuit according to an embodiment of the present invention in the order of steps.

Subsequently, the resist pattern RP5 is removed and after that, as shown in FIG. 11, n-type impurity, for example, phosphorous is ion-implanted into the channel region of the high Vth PMOS formation region in the region B with resist pattern RP6 as a mask. The aforementioned phosphorus is implanted in a condition that the implantation energy is 20 keV and the dose amount is $1.1\times10^{13}$ cm$^{-2}$.

Figure 12:
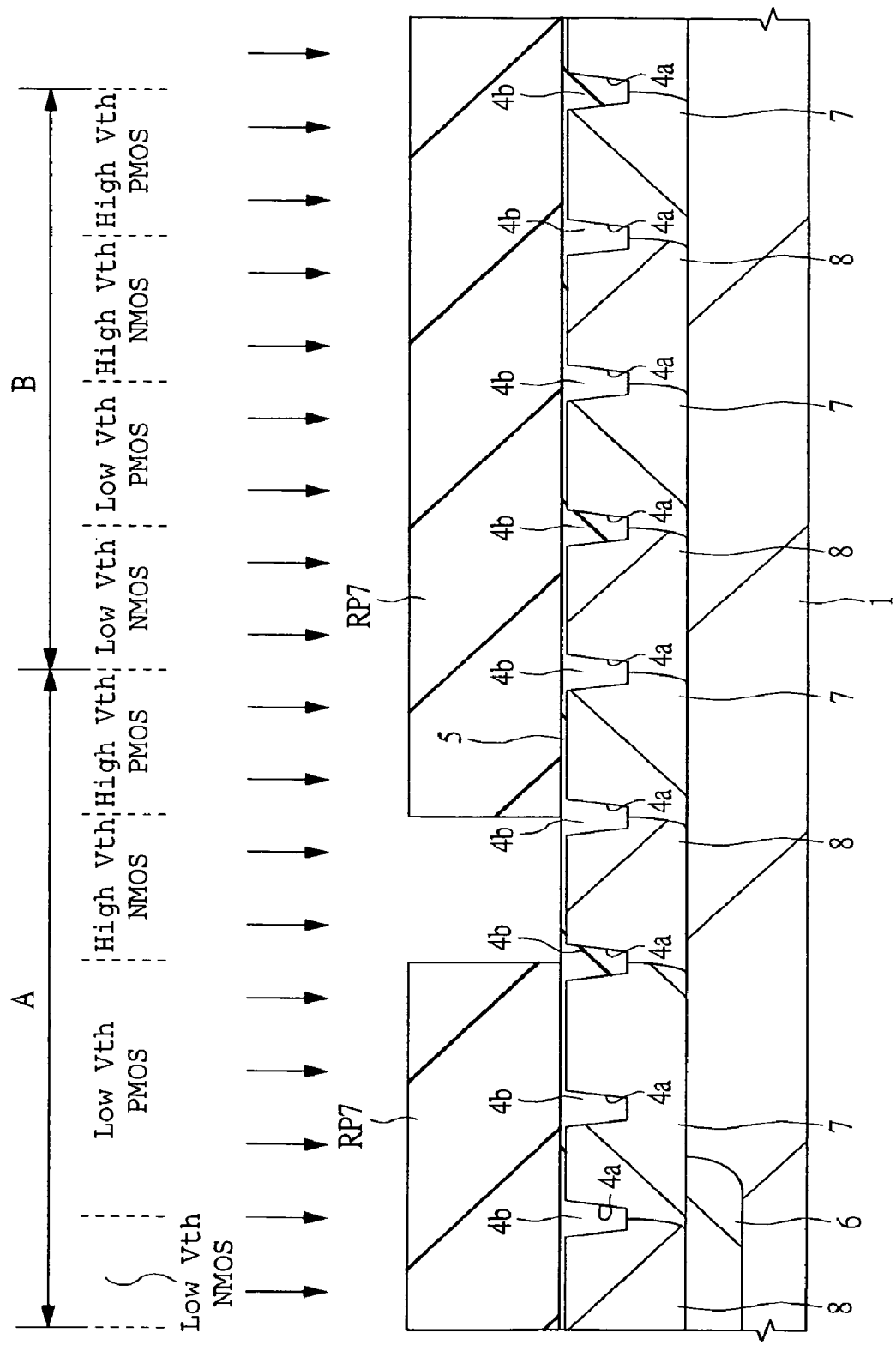
FIG. 12 is a major part sectional view of a semiconductor substrate showing an example of the manufacturing method of a semiconductor integrated circuit according to an embodiment of the present invention in the order of steps.

After the resist pattern RP6 is removed, as shown in FIG. 12, p-type impurity, for example, boron fluoride is ion-implanted into the channel region of the high Vth NMOS formation region in the region A with the resist pattern RP7 as a mask. The aforementioned boron fluoride is implanted in a condition that the implantation energy is 25 keV and the dose amount is $8\times10^{12}$ cm$^{-2}$.

Figure 13:
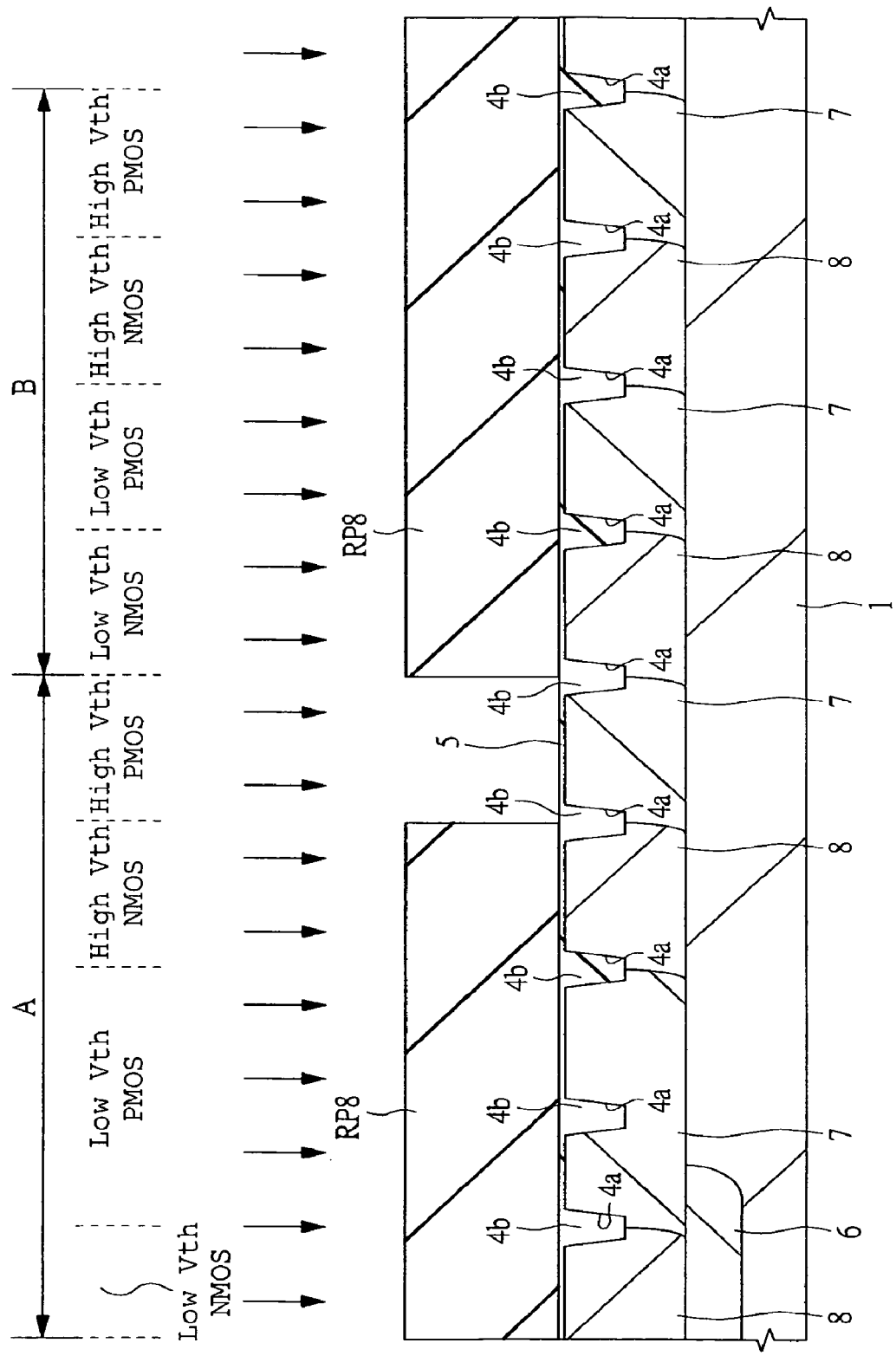
FIG. 13 is a major part sectional view of a semiconductor substrate showing an example of the manufacturing method of a semiconductor integrated circuit according to an embodiment of the present invention in the order of steps.

Subsequently, after the resist pattern RP7 is removed, as shown in FIG. 13, n-type impurity, for example, phosphorous is ion-implanted into the channel region of the high Vth PMOS formation region in the region A with the resist pattern RP8 as a mask. The aforementioned phosphorous is implanted in a condition that the implantation energy is 20 keV and the dose amount is $1\times10^{13}$ cm$^{-2}$.

Figure 14:
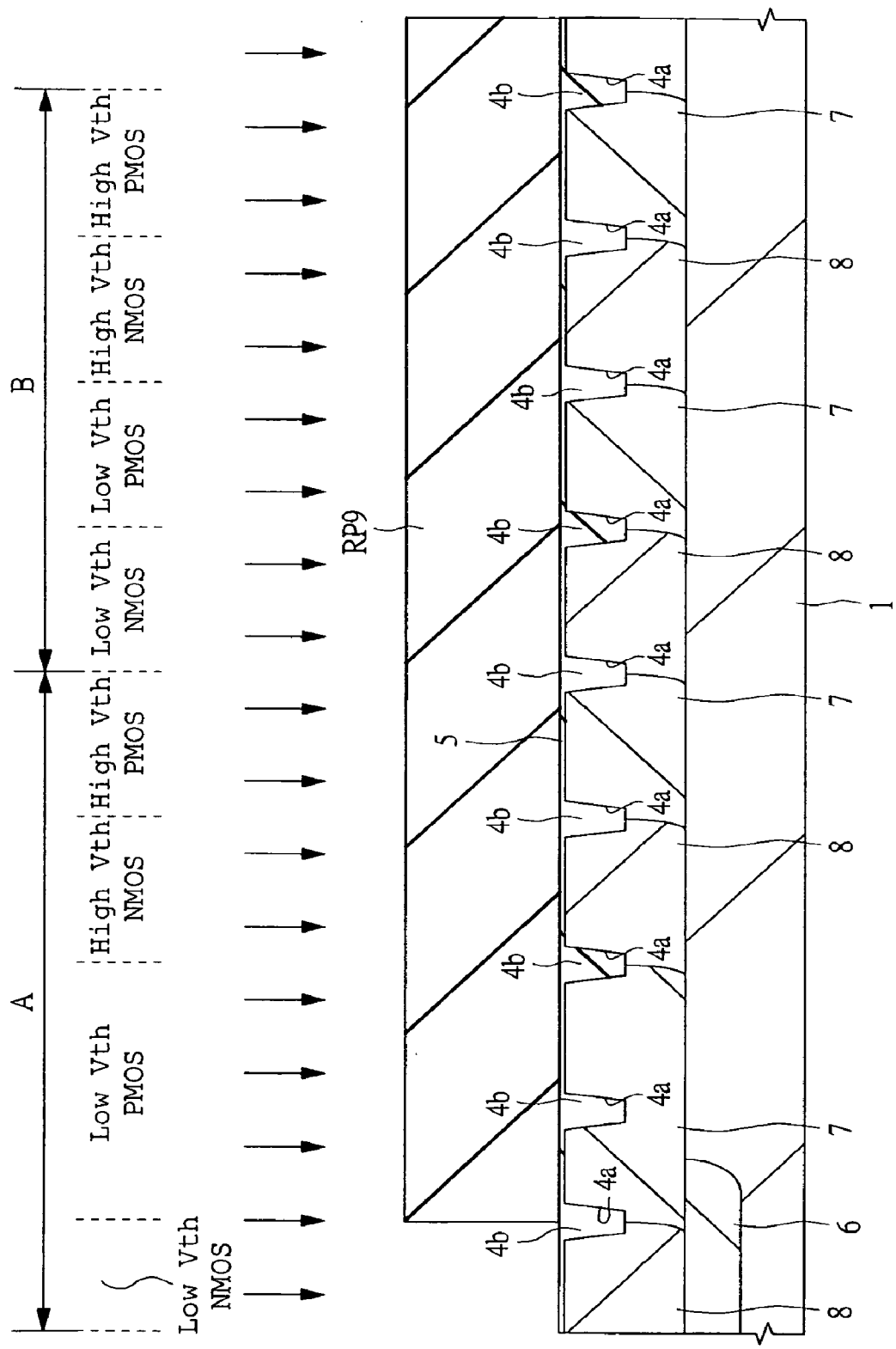
FIG. 14 is a major part sectional view of a semiconductor substrate showing an example of the manufacturing method of a semiconductor integrated circuit according to an embodiment of the present invention in the order of steps.

Subsequently, after the resist pattern RP8 is removed, as shown in FIG. 14, p-type impurity, for example, boron fluoride is ion-implanted into the channel region of the low Vth NMOS formation region in the region A with the resist pattern RP9 as a mask. The aforementioned boron fluoride is implanted in a condition that the implantation energy is 25 keV and the dose amount is $2\times10^{12}$ cm$^{-2}$.

Figure 15:
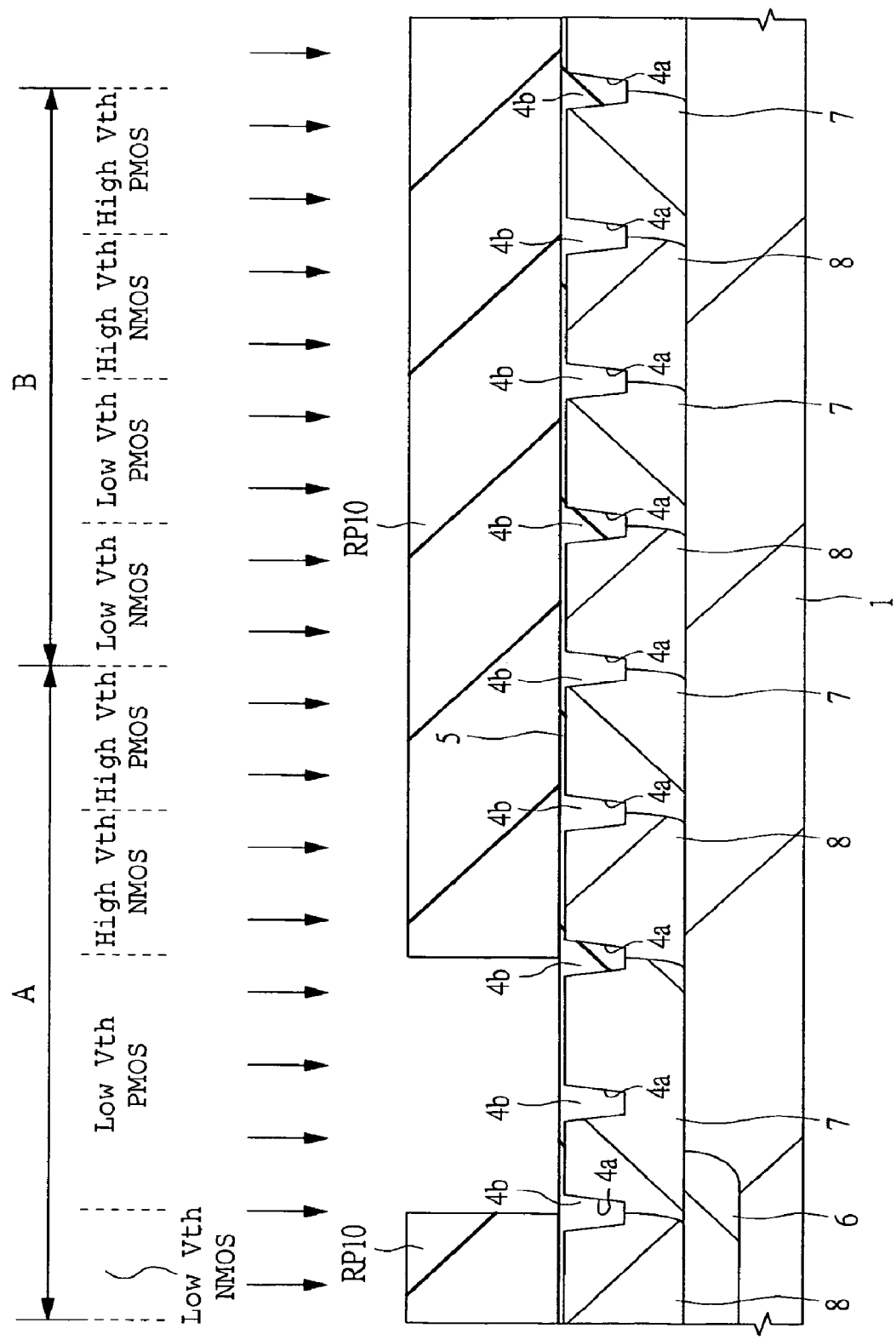
FIG. 15 is a major part sectional view of a semiconductor substrate showing an example of the manufacturing method of a semiconductor integrated circuit according to an embodiment of the present invention in the order of steps.

Subsequently, after the resist pattern RP9 is removed, as shown in FIG. 15, n-type impurity, for example, phosphorus is ion-implanted into the channel region of the low Vth PMOS formation region in the region A with resist pattern RP10 as a mask. The aforementioned phosphorous is implanted in a condition that the implantation energy is 20 keV and the dose amount is $5\times10^{12}$ cm$^{-2}$.

Figure 16:
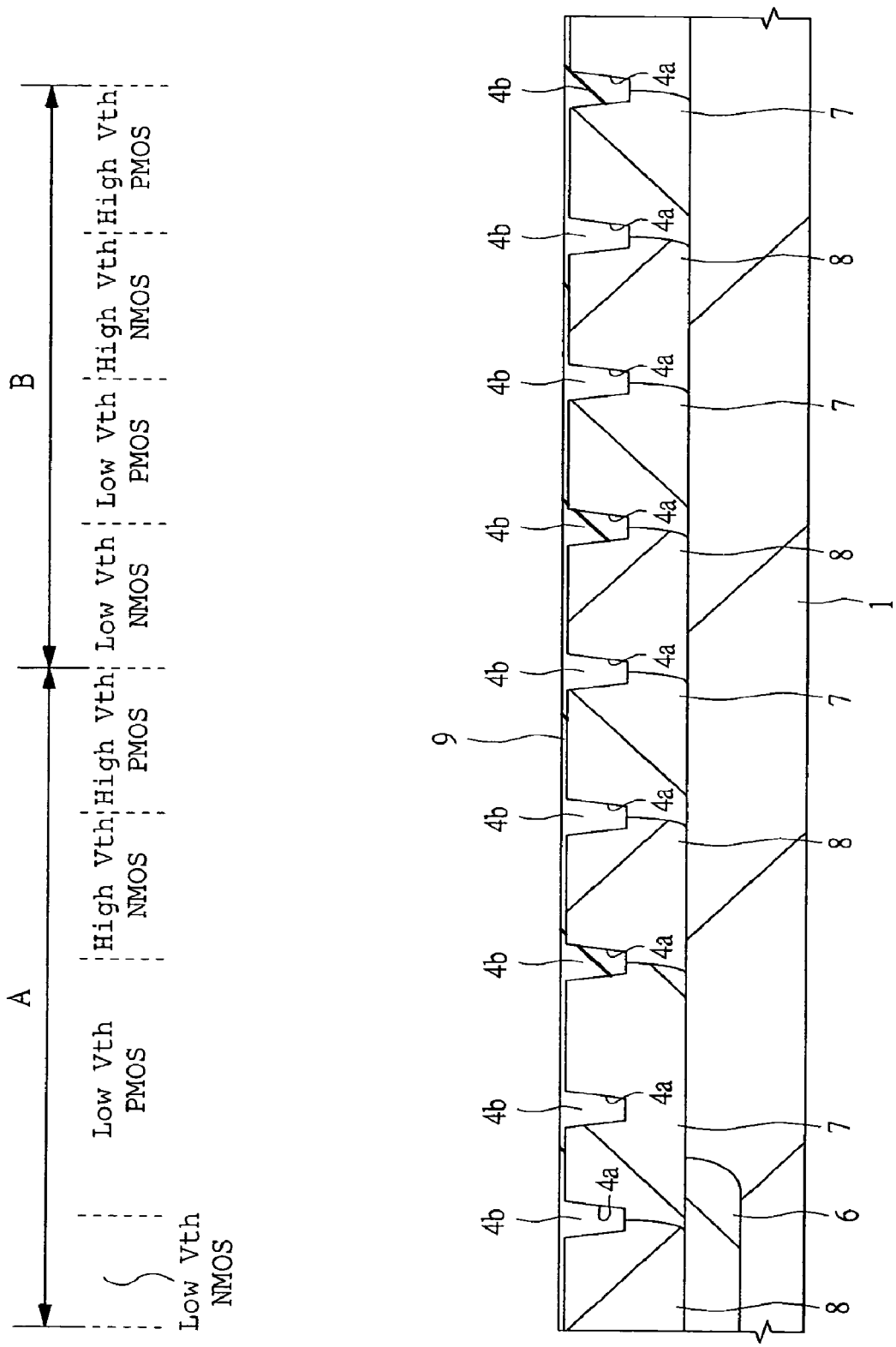
FIG. 16 is a major part sectional view of a semiconductor substrate showing an example of the manufacturing method of a semiconductor integrated circuit according to an embodiment of the present invention in the order of steps.

Next, after the resist pattern RP10 is removed, as shown in FIG. 16, the protective film 5 is removed and the silicon oxide film 9 is formed on the surface of the semiconductor substrate 1, for example, in the thickness of 4 to 5 nm. The silicon oxide film 9 can be formed according to the thermal CVD method or thermal oxidation method. Meanwhile, the aforementioned silicon oxide film may be turned to silicon nitride film by nitriding the semiconductor substrate 1 thermally. The aforementioned thermal nitration is carried out with the semiconductor 1 heated at about 900° C. in a pressure reduced atmosphere containing nitrogen made radical by plasma discharge.

Figure 17:
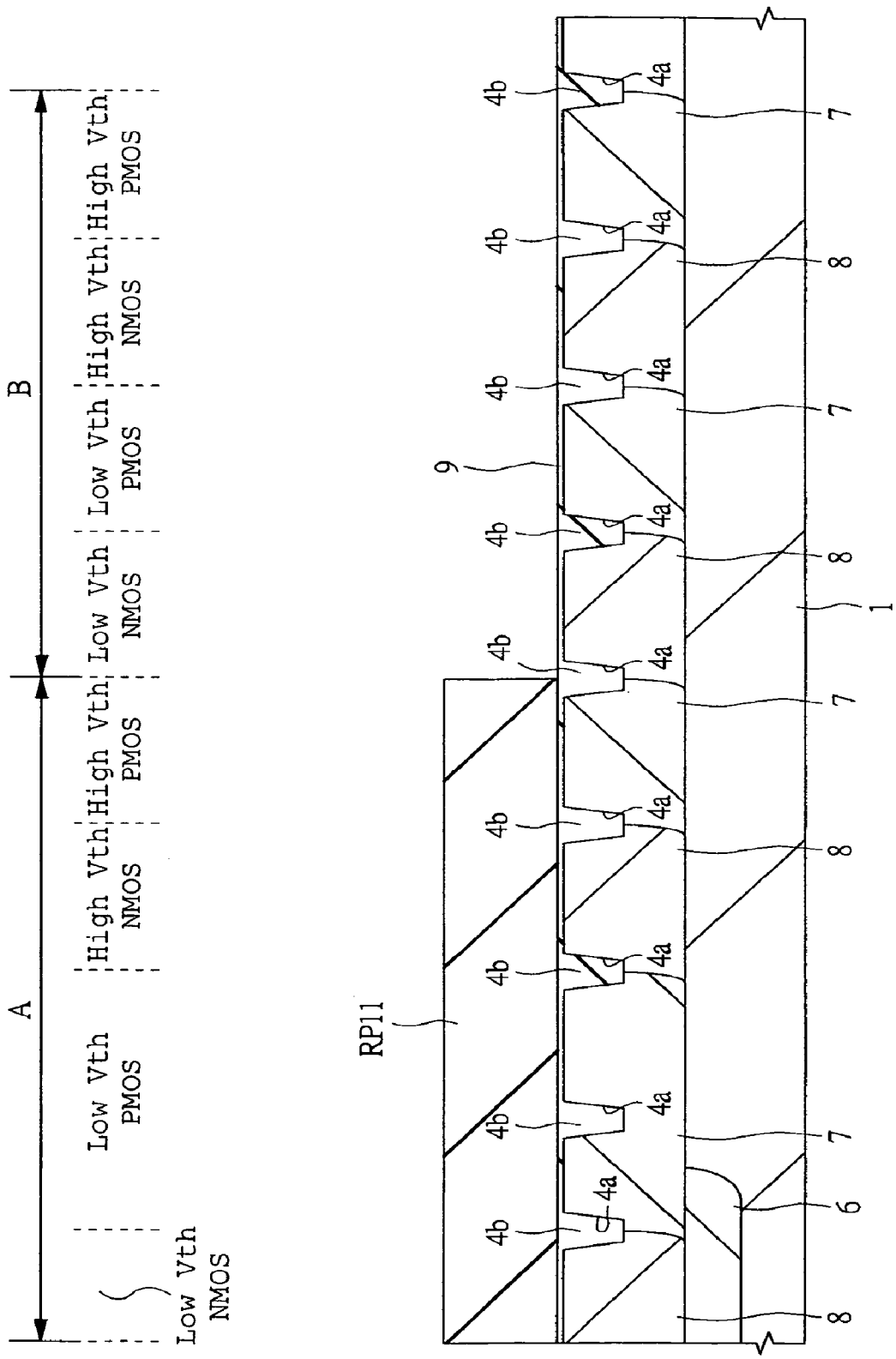
FIG. 17 is a major part sectional view of a semiconductor substrate showing an example of the manufacturing method of a semiconductor integrated circuit according to an embodiment of the present invention in the order of steps.
Figure 18:
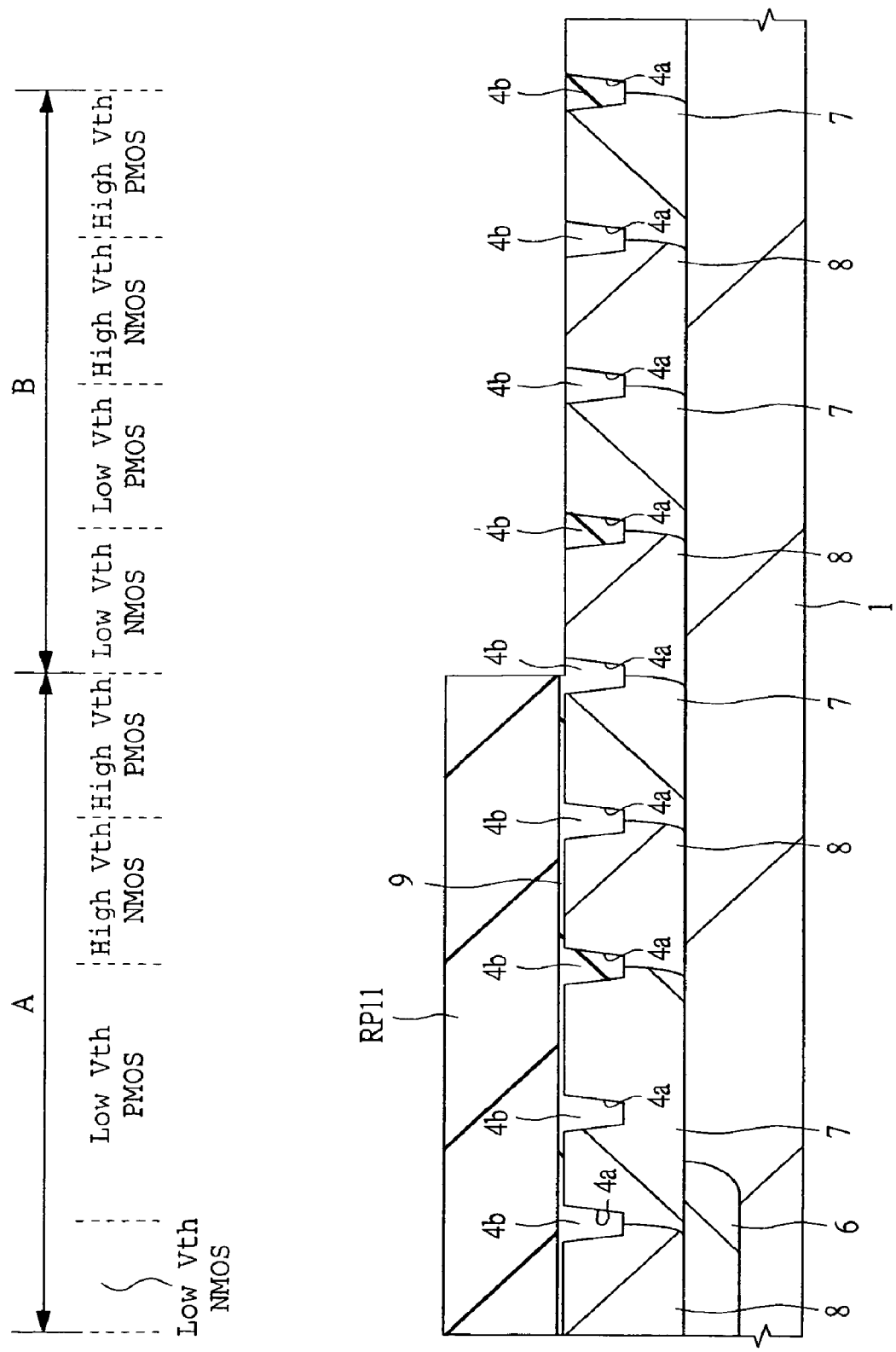
FIG. 18 is a major part sectional view of a semiconductor substrate showing an example of the manufacturing method of a semiconductor integrated circuit according to an embodiment of the present invention in the order of steps.
Figure 19:
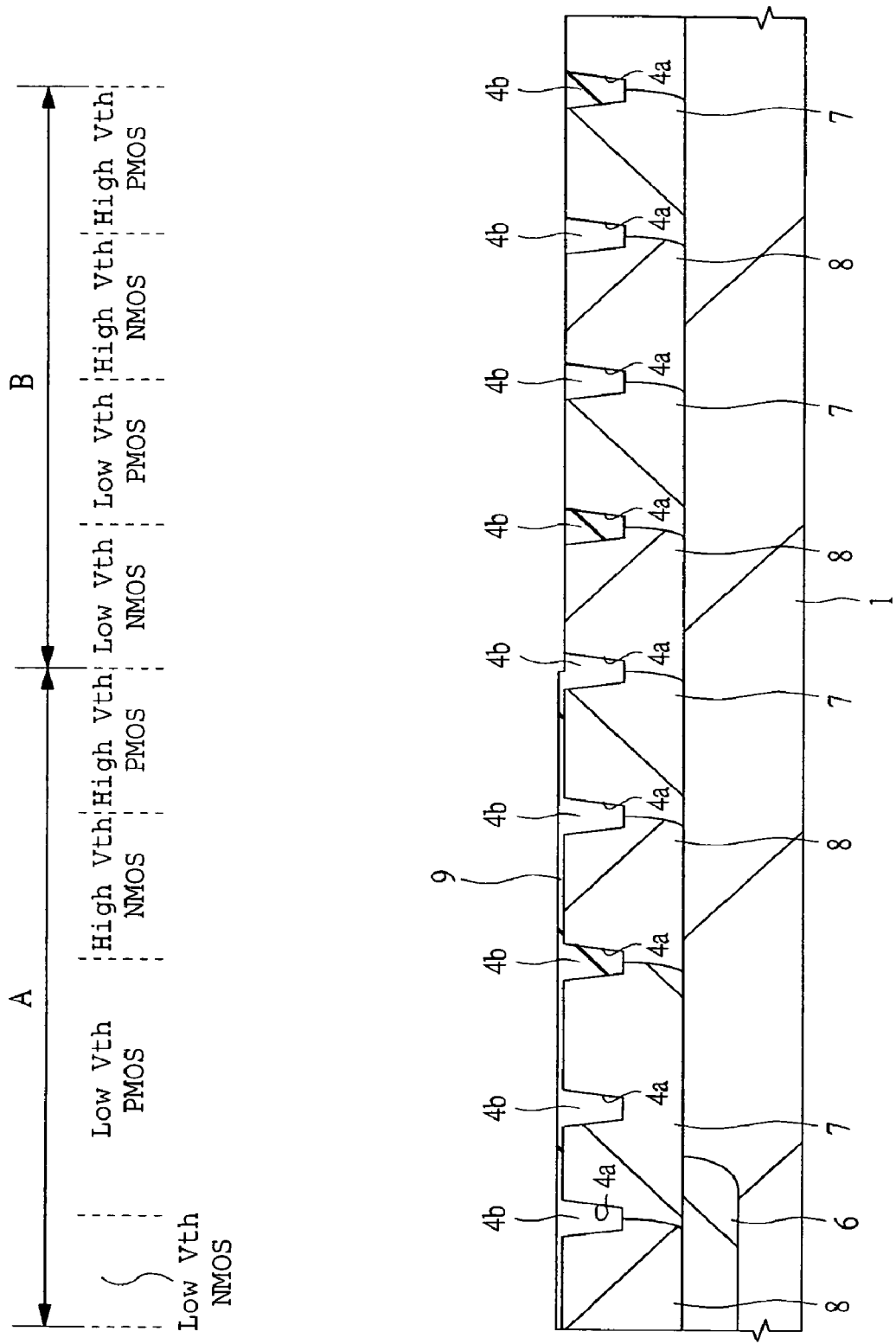
FIG. 19 is a major part sectional view of a semiconductor substrate showing an example of the manufacturing method of a semiconductor integrated circuit according to an embodiment of the present invention in the order of steps.

Next, as shown in FIG. 17, after the region A is covered with the resist pattern RP1, as shown in FIG. 18, the silicon oxide film 9 in the region B is removed using diluted HF with resist pattern RP11 as a mask. After that, as shown in FIG. 19, the resist pattern RP11 is removed.

Figure 20:
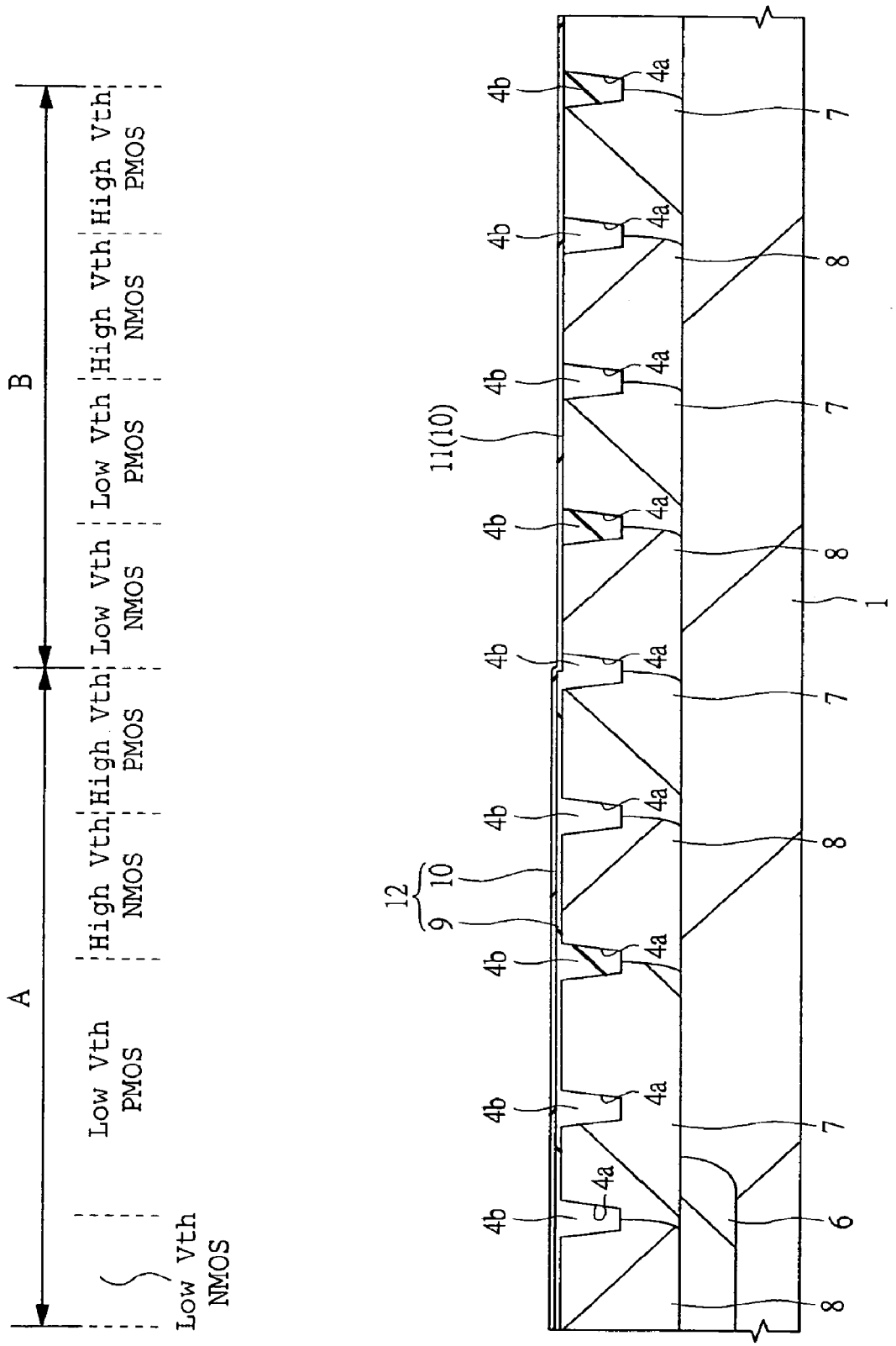
FIG. 20 is a major part sectional view of a semiconductor substrate showing an example of the manufacturing method of a semiconductor integrated circuit according to an embodiment of the present invention in the order of steps.

Next, as shown in FIG. 20, high dielectric constant insulation film 10, for example, alumina film is formed on the semiconductor substrate 1. The high dielectric constant insulation film 10 can be deposited according to, for example, spattering method. The thickness of the high dielectric constant insulation film 10 formed on the semiconductor substrate 1 is set so that its effective thickness is about 5 nm. For example, the alumina film is deposited in the thickness of about 10 nm considering dielectric constant. Consequently, gate insulation film 11 comprised of the high dielectric constant insulation film 10 about 5 nm in terms of its effective thickness is formed in the region B and gate insulation film 12 comprised of stacked film of the high dielectric constant film 10 and the silicon oxide film 9 about 9 to 10 nm in terms of its effective thickness is formed in the region A.

Before forming the aforementioned high dielectric constant insulation film 10 on the semiconductor substrate 1, silicon oxide film or silicon nitride film, or silicon oxide nitride film less than 1 nm or less may be formed to stabilize an interface with the semiconductor substrate 1.

Figure 21:
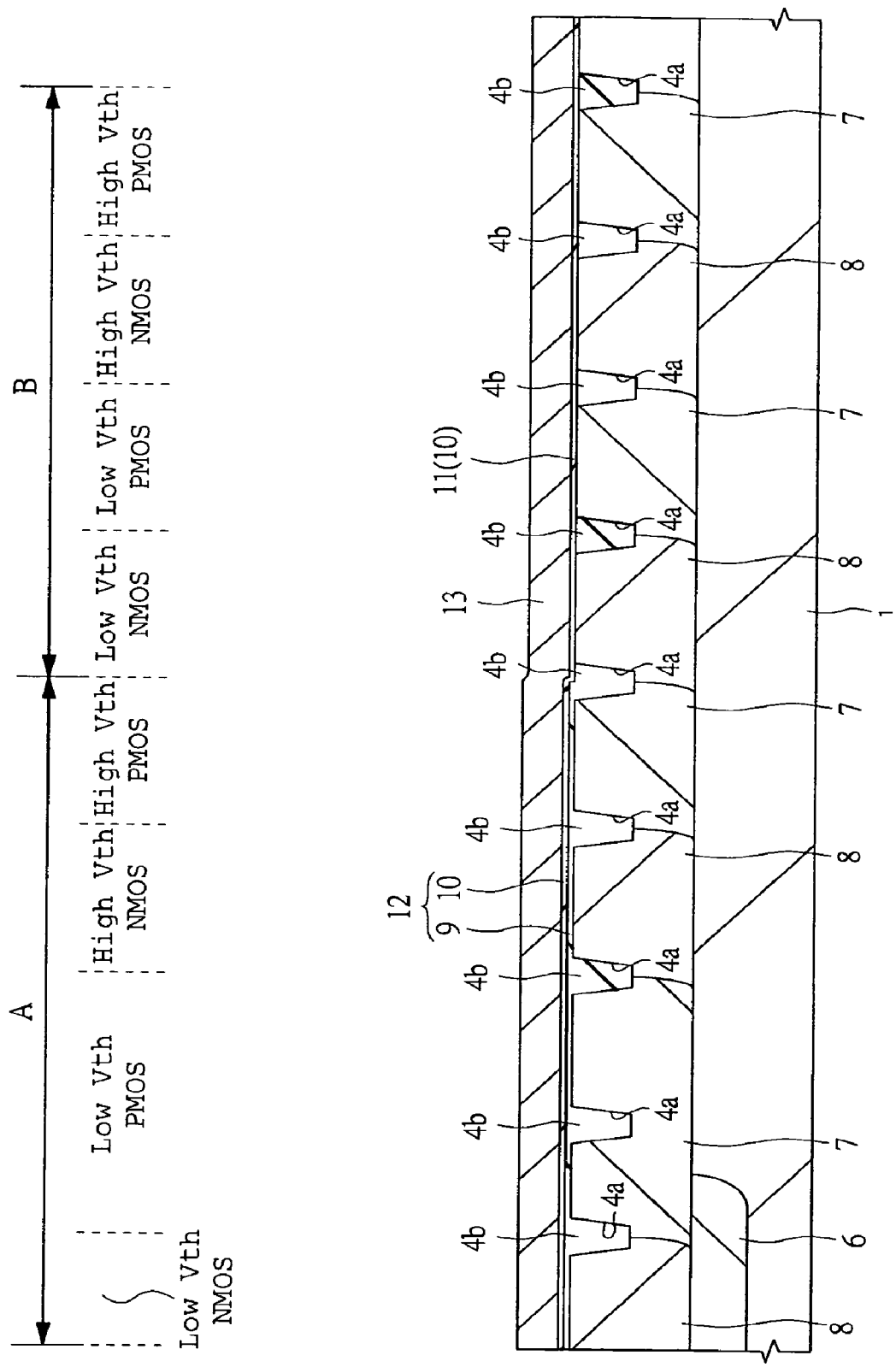
FIG. 21 is a major part sectional view of a semiconductor substrate showing an example of the manufacturing method of a semiconductor integrated circuit according to an embodiment of the present invention in the order of steps.

Next, as shown in FIG. 21, silicon film 13 about 200 nm thick is deposited on the semiconductor substrate 1 according to the CVD method.

Figure 22:
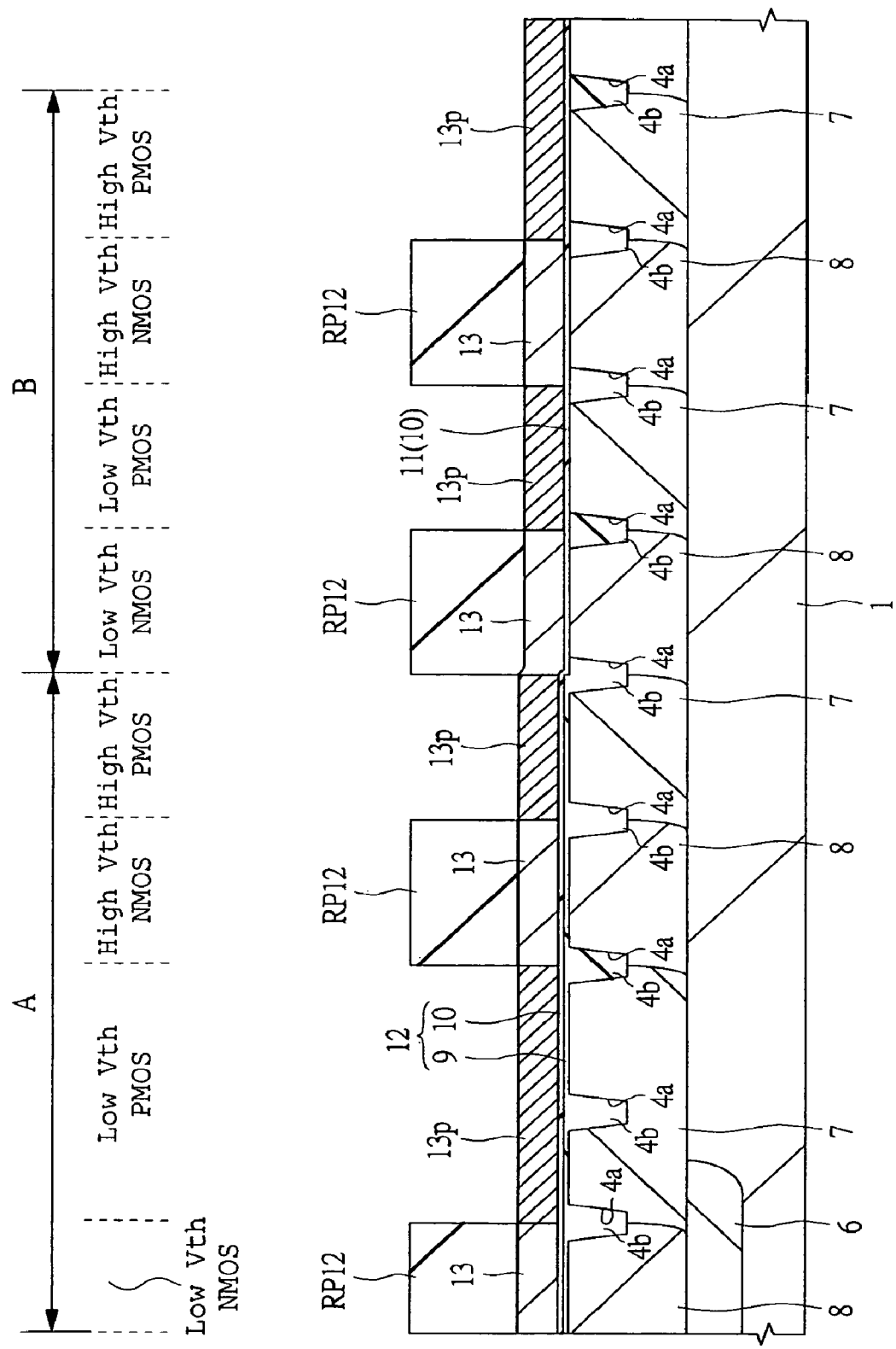
FIG. 22 is a major part sectional view of a semiconductor substrate showing an example of the manufacturing method of a semiconductor integrated circuit according to an embodiment of the present invention in the order of steps.

Next, as shown in FIG. 22, after resist pattern 12 is formed in the NMOS formation region in the regions A, B, p-type impurity, for example, boron is ion-implanted into the silicon film 13 in the PMOS formation region in the regions A, B with this resist pattern RP12 as a mask.

Figure 23:
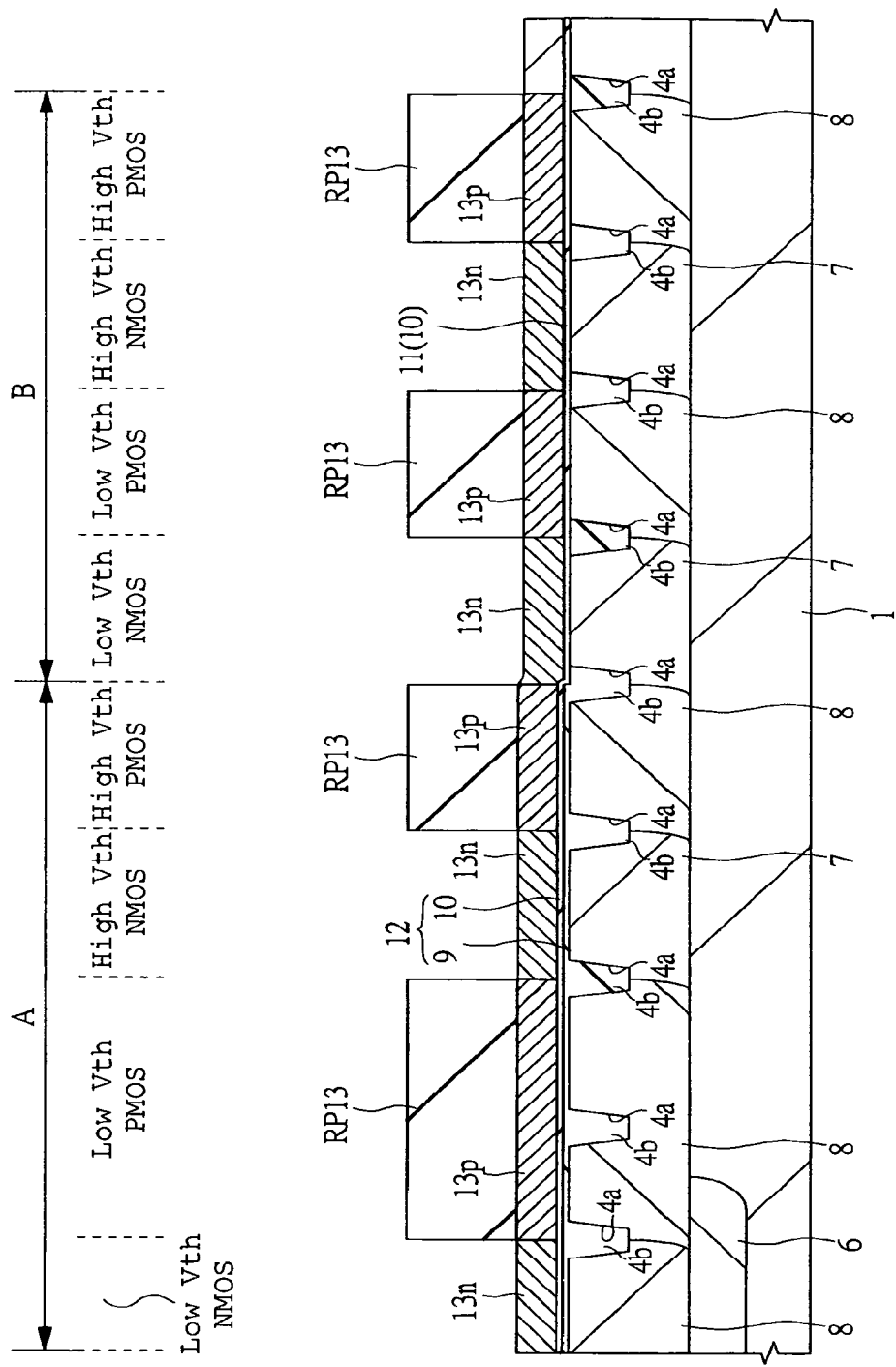
FIG. 23 is a major part sectional view of a semiconductor substrate showing an example of the manufacturing method of a semiconductor integrated circuit according to an embodiment of the present invention in the order of steps.

Next, the resist pattern 12 is removed and as shown in FIG. 23, resist pattern RP13 is formed in the PMOS formation region in the regions A, B. After that, n-type impurity, for example, phosphorus is ion-implanted into the NMOS formation region in the regions A, B with this resist pattern RP13 as a mask.

Next, after the resist pattern RP13 is removed, by performing heat treatment on the semiconductor substrate 1, for example at 950° C. for about 60 seconds, the aforementioned n-type impurity and p-type impurity implanted into the silicon film 13 are activated. Further, the silicon film 13 in the NMOS formation region in the regions A, B is turned to n-type silicon polycrystal film and the silicon film 13 in the PMOS formation region in the regions A, B is changed to p-type silicon polycrystal film.

Figure 24:
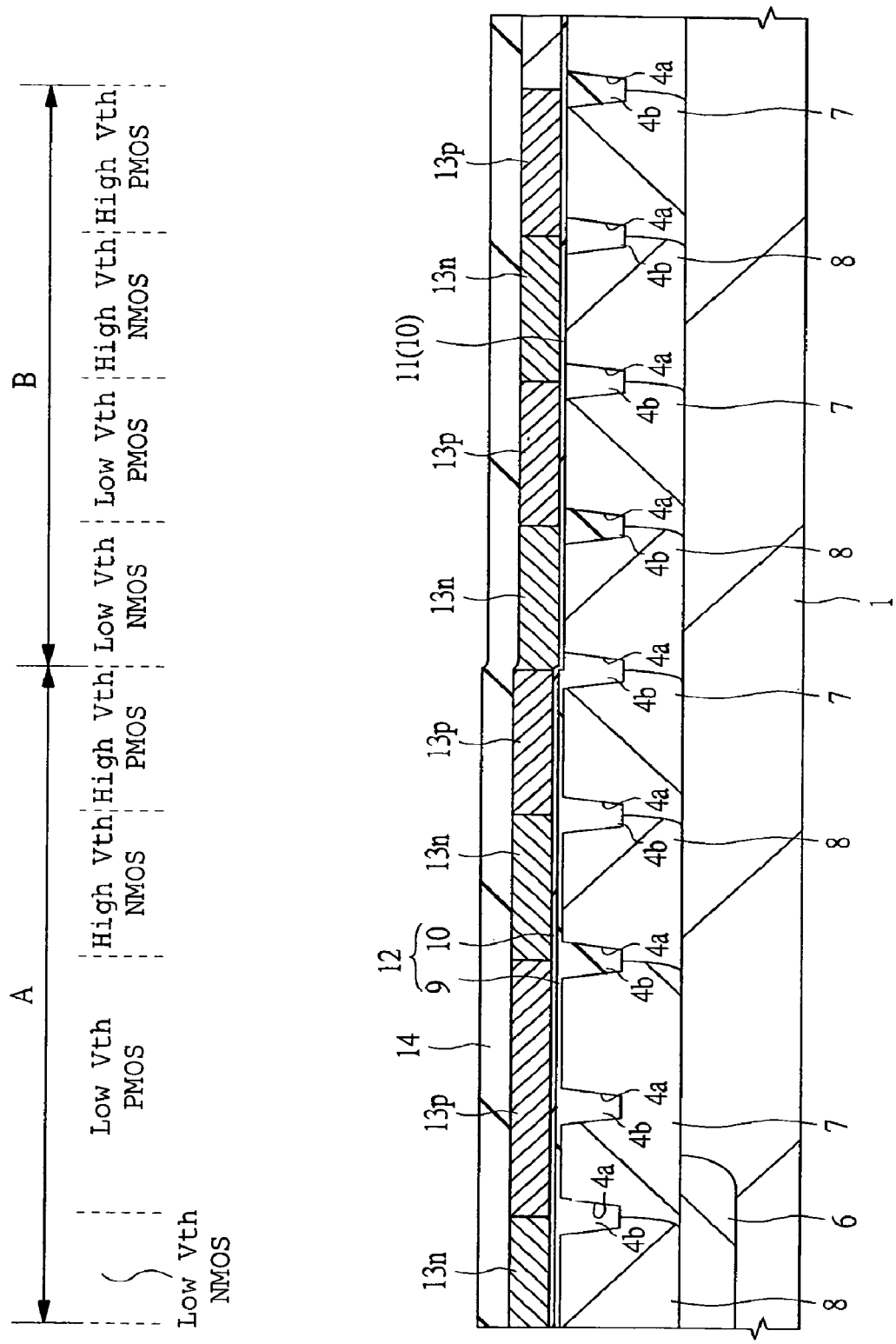
FIG. 24 is a major part sectional view of a semiconductor substrate showing an example of the manufacturing method of a semiconductor integrated circuit according to an embodiment of the present invention in the order of steps.
Figure 25:
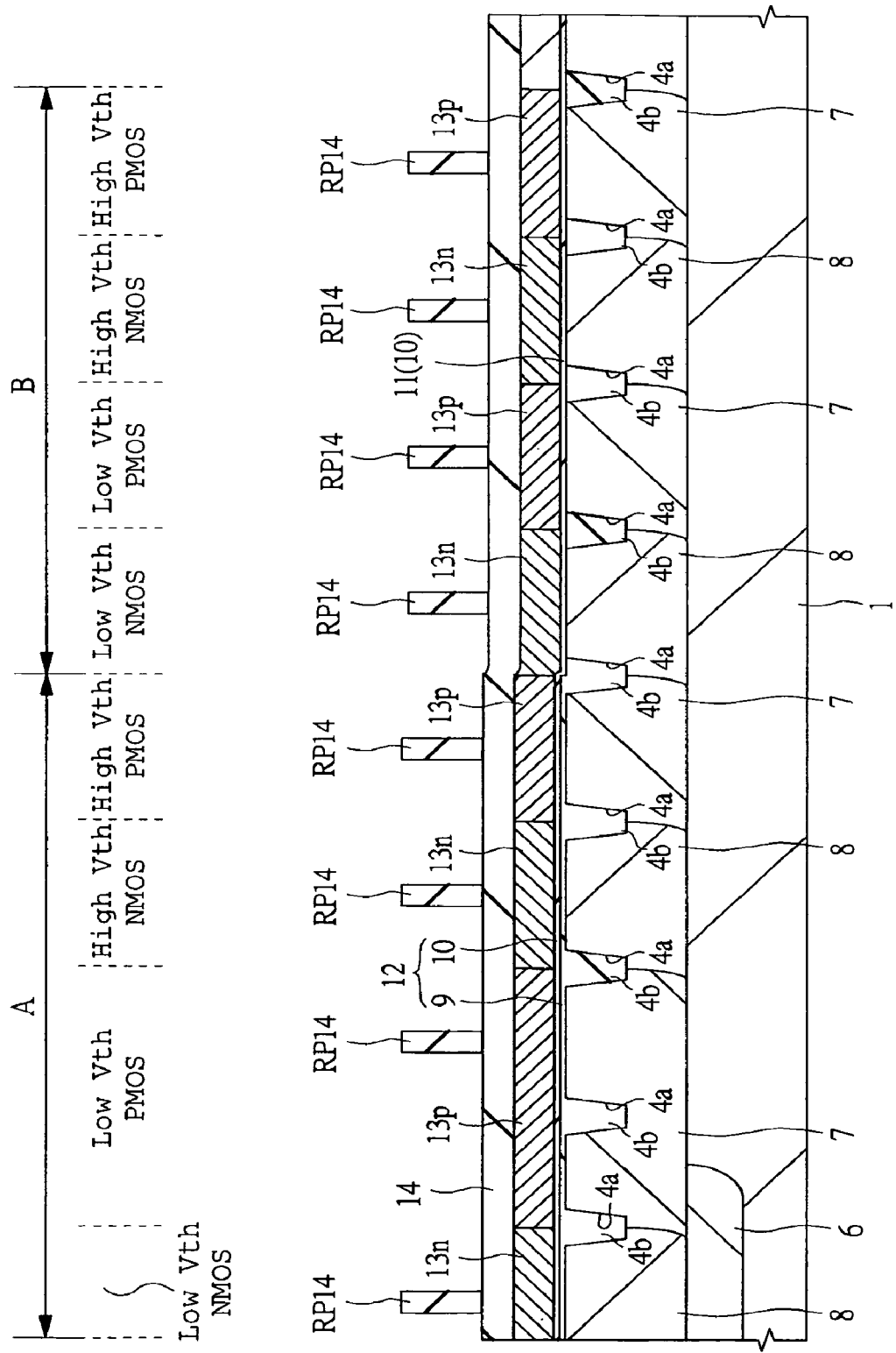
FIG. 25 is a major part sectional view of a semiconductor substrate showing an example of the manufacturing method of a semiconductor integrated circuit according to an embodiment of the present invention in the order of steps.

After as shown in FIG. 24, silicon oxide film 14 is deposited on the semiconductor substrate 1 according to the CVD method, as shown in FIG. 25, resist pattern RP14 is formed to form gate electrodes of the n-channel and p-channel MIS transistor.

Figure 26:
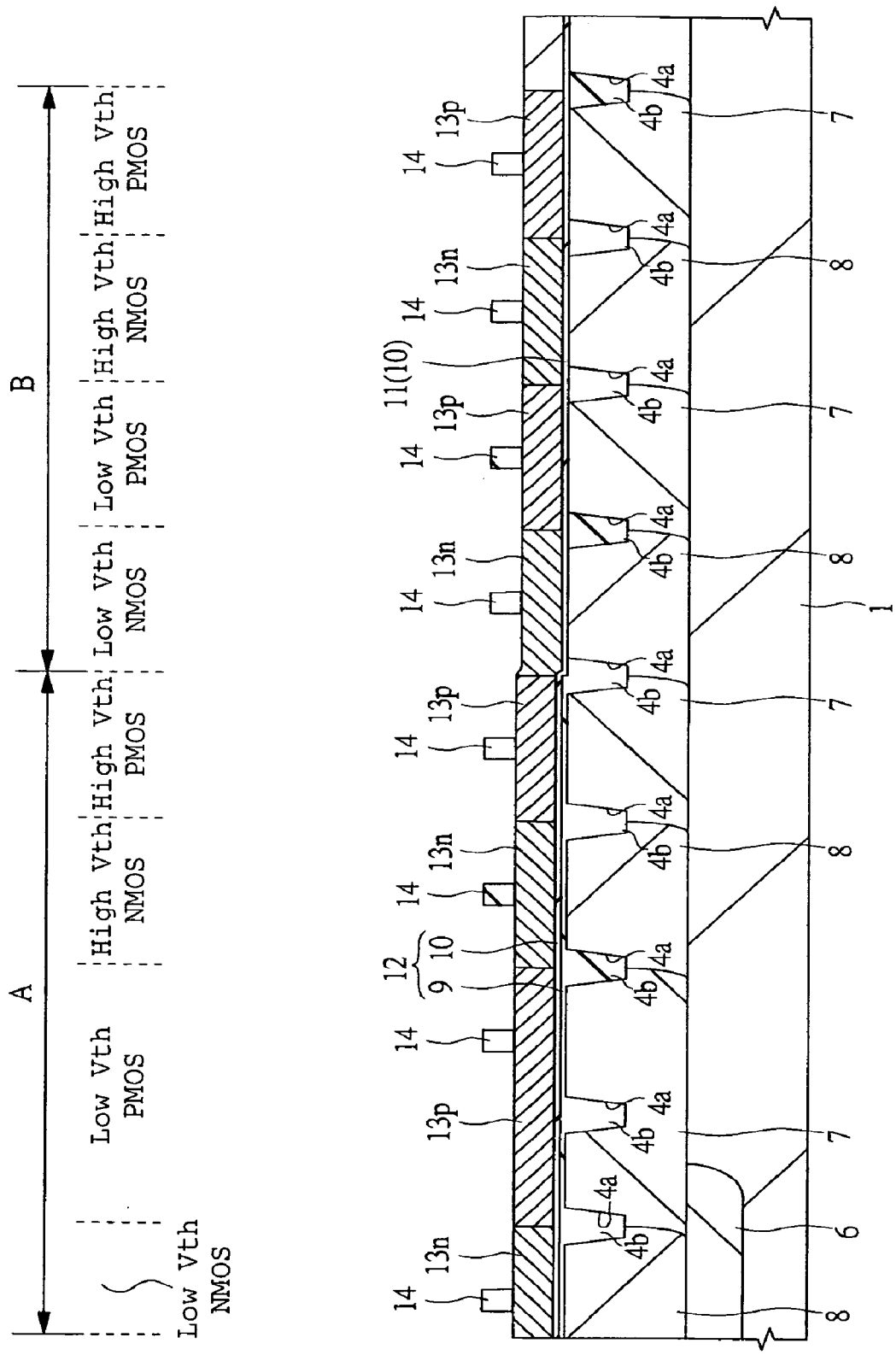
FIG. 26 is a major part sectional view of a semiconductor substrate showing an example of the manufacturing method of a semiconductor integrated circuit according to an embodiment of the present invention in the order of steps.
Figure 27:
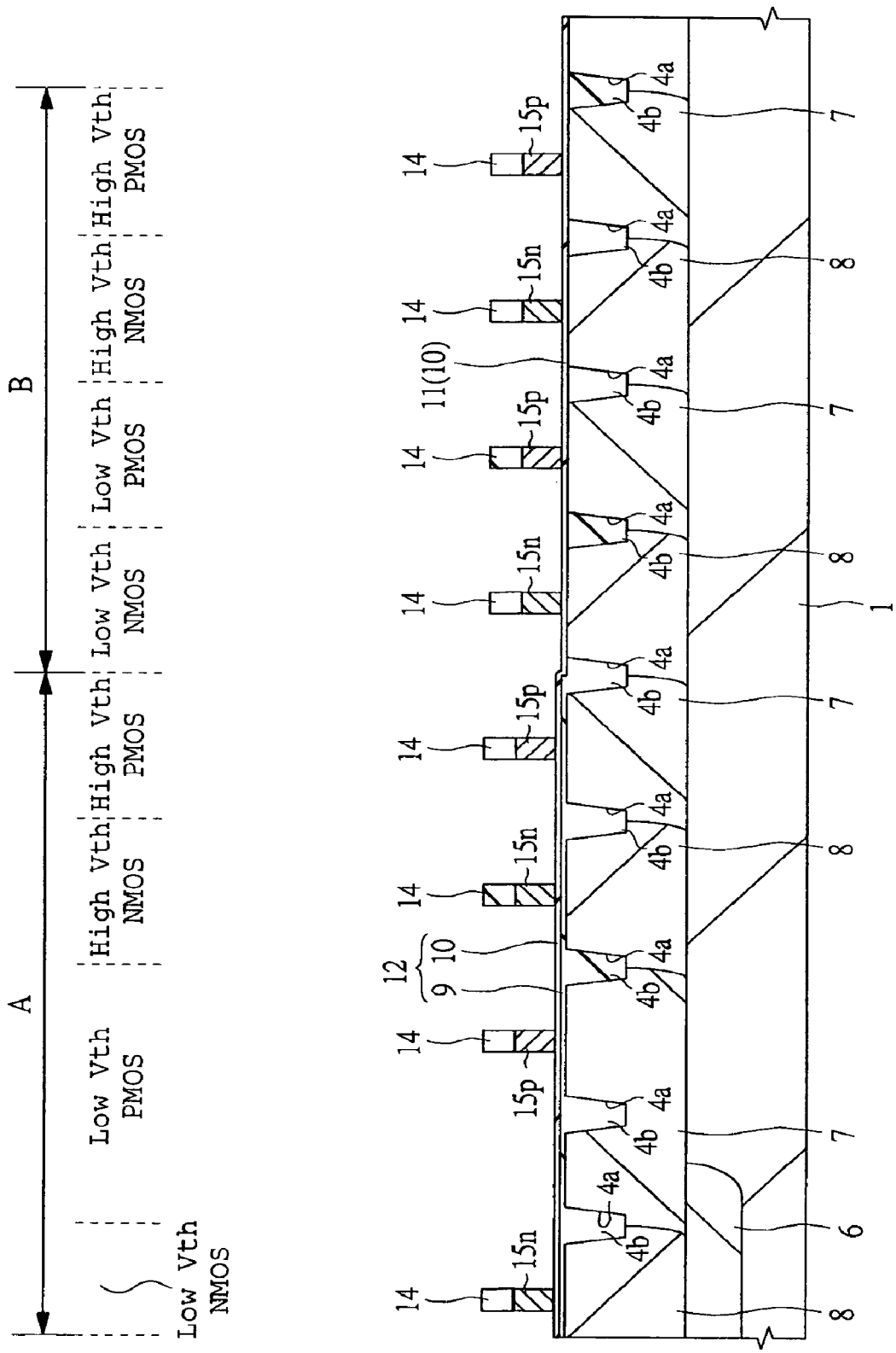
FIG. 27 is a major part sectional view of a semiconductor substrate showing an example of the manufacturing method of a semiconductor integrated circuit according to an embodiment of the present invention in the order of steps.

Next, after as shown in FIG. 26, the silicon oxide film 14 is etched with the resist pattern RP14 as a mask, the resist pattern RP14 is removed. Subsequently, as shown in FIG. 27, with the patterned silicon oxide film 14 as a mask, the silicon film 13 is etched so as to form a gate electrode (conductive piece) 15n comprised of n-type silicon polycrystal film in the NMOS formation region in the regions A, B and a gate electrode (conductive piece) comprised of p-type silicon polycrystal film in the PMOS formation region in the regions A, B.

Figure 28:
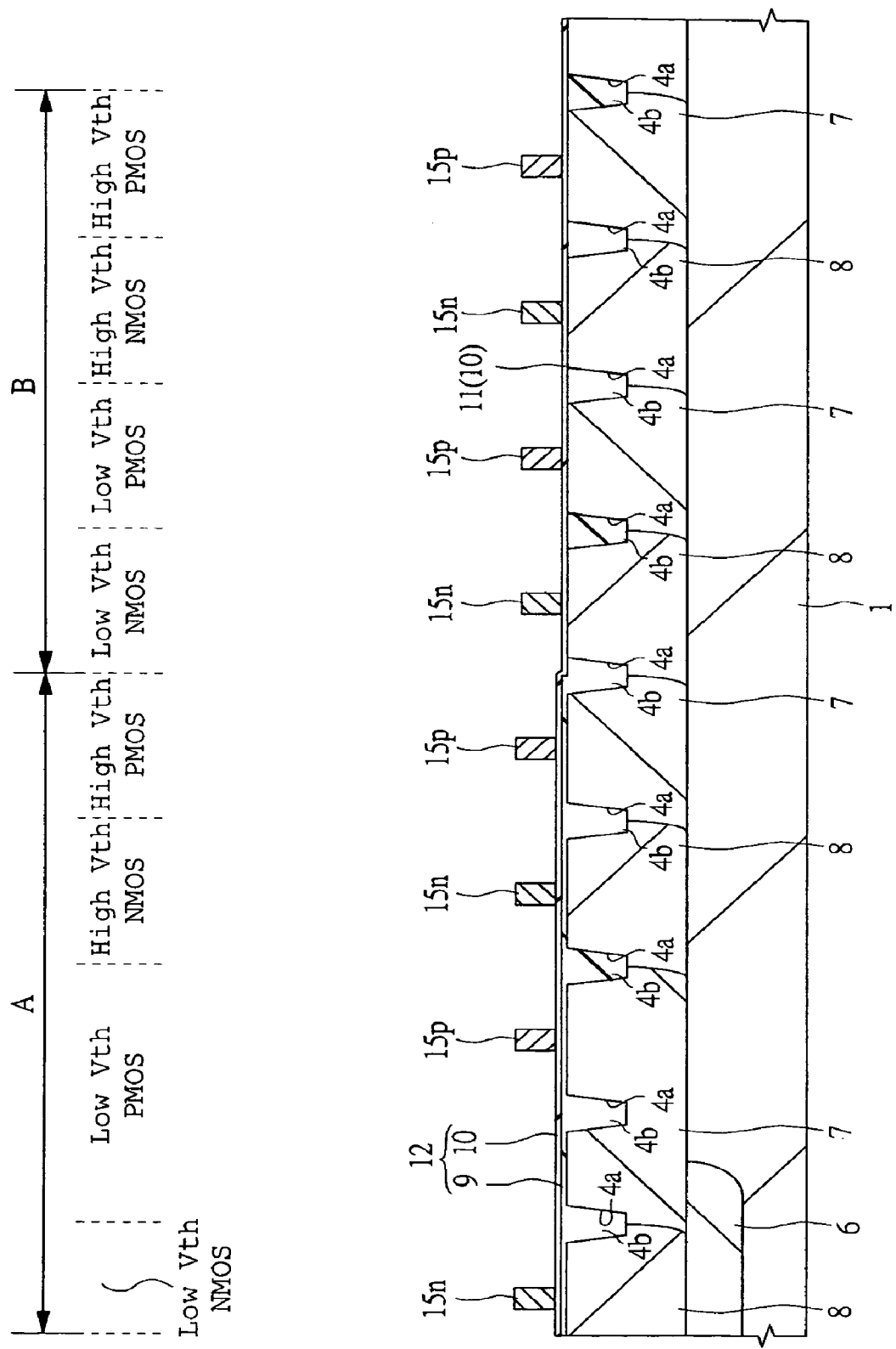
FIG. 28 is a major part sectional view of a semiconductor substrate showing an example of the manufacturing method of a semiconductor integrated circuit according to an embodiment of the present invention in the order of steps.

Next, after the silicon oxide film 14 is removed as shown in FIG. 28, oxidized in dry-$O_2$ atmosphere at about 800° C. is performed on the semiconductor substrate 1.

Figure 29:
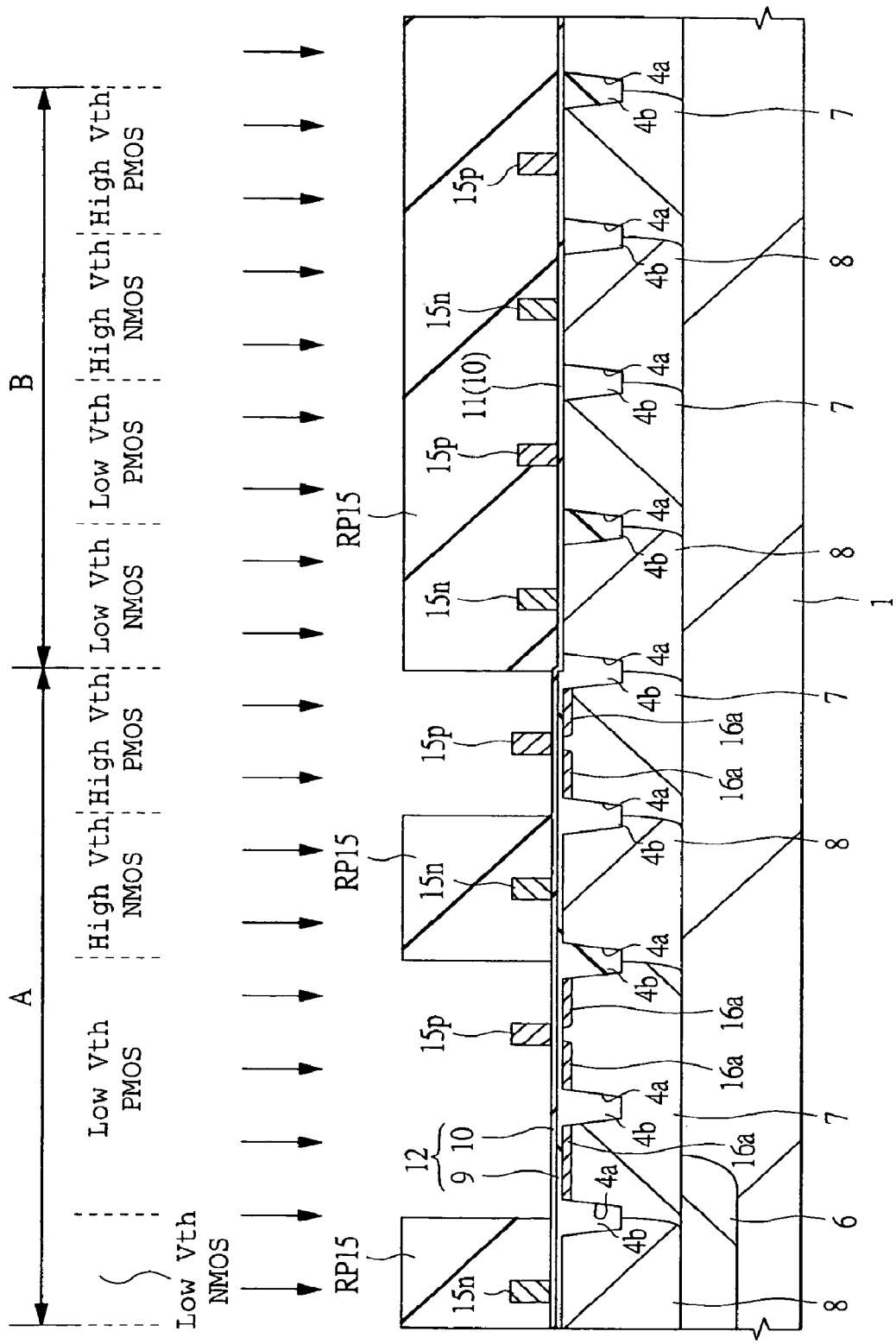
FIG. 29 is a major part sectional view of a semiconductor substrate showing an example of the manufacturing method of a semiconductor integrated circuit according to an embodiment of the present invention in the order of steps.

Next, with the resist pattern RP15 as a mask, as shown in FIG. 29, p-type impurity, for example, boron fluoride is ion-implanted into the n-well 7 in the PMOS formation region of the regions A so as to form p-type diffusion regions 16a in the n-well 7 on both sides of the gate electrode 15p. Subsequently, by ion-implanting n-type impurity, for example, phosphorous, a halo layer which functions as a punch-through stopper layer, is formed. The aforementioned boron fluoride is implanted in a condition that the implantation energy is 2 to 3 keV and the dose amount is $1 \times 10^{15}$ cm$^{-2}$, and the aforementioned phosphorus is implanted in a condition that the implantation energy is 55 keV and the dose amount is $4 \times 10^{12}$ cm$^{-2}$.

Figure 30:
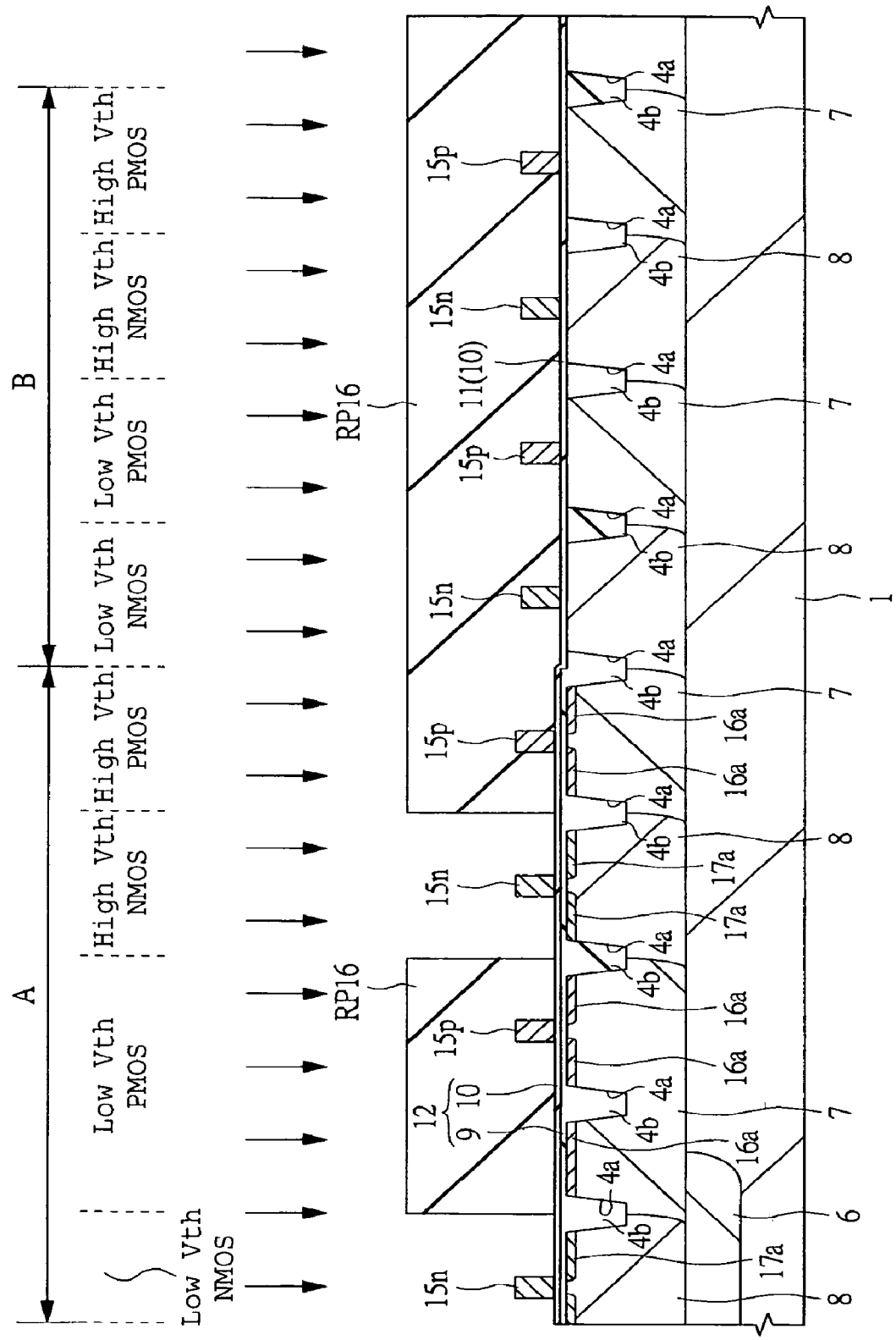
FIG. 30 is a major part sectional view of a semiconductor substrate showing an example of the manufacturing method of a semiconductor integrated circuit according to an embodiment of the present invention in the order of steps.

Next, after the resist pattern RP15 is removed, as shown in FIG. 30, n-type impurity, for example, arsenic is ion-implanted into the p-well 8 in the NMOS formation region of the region A with the resist pattern RP16 as a mask, so as to form n-type diffusion region 17a in the p-well 8 on both sides of the gate electrode 15n. Subsequently, by ion-implanting p-type impurity, for example, boron, halo layer is formed. The aforementioned arsenic is implanted in a condition that the implantation energy is 5 keV and the dose amount is $2 \times 10^{15}$ cm$^{-2}$ and the aforementioned boron is implanted in a condition that the implantation energy is 20 keV and the dose amount is $6 \times 10^{12}$ cm$^{-2}$.

Figure 31:
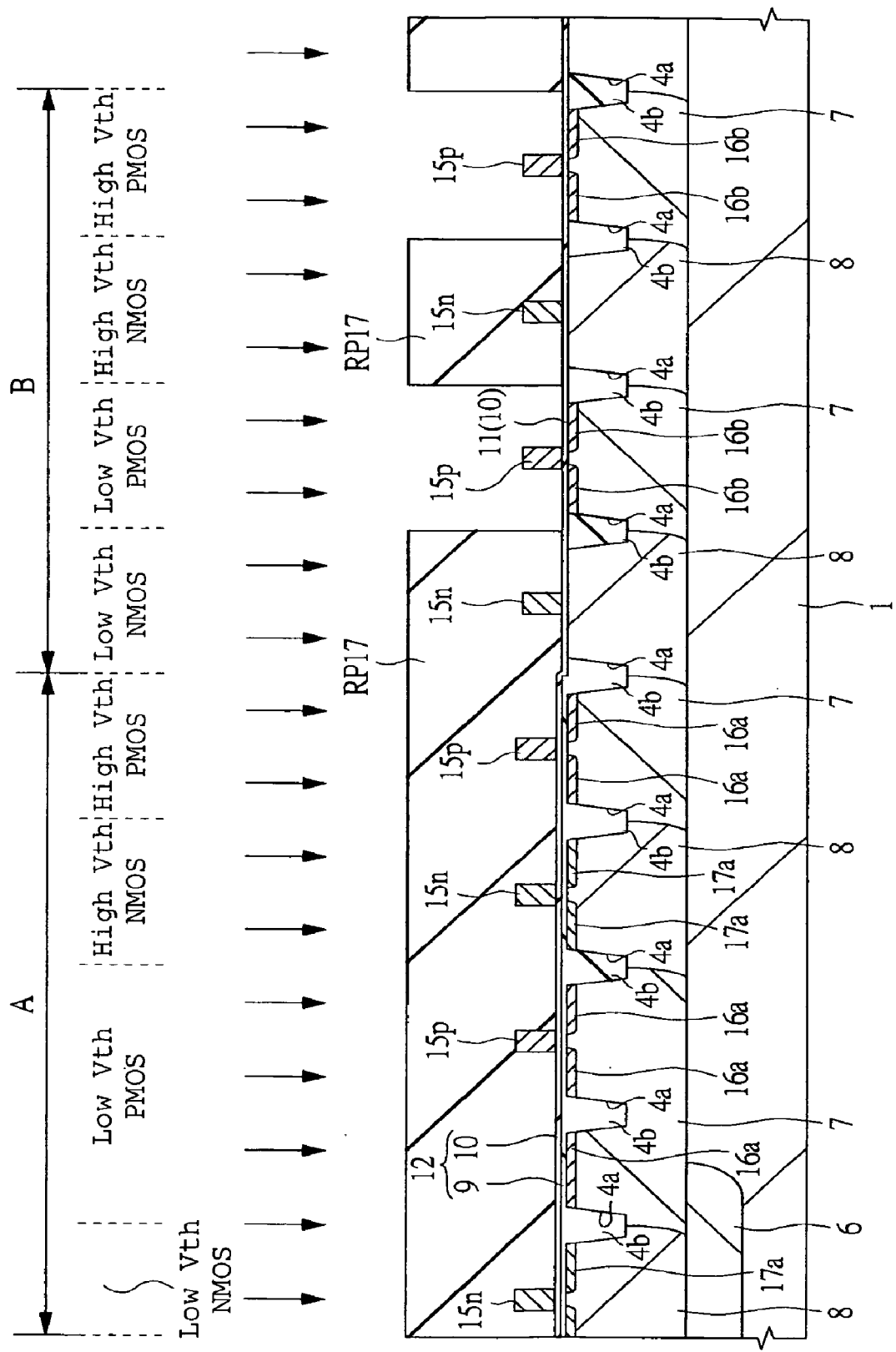
FIG. 31 is a major part sectional view of a semiconductor substrate showing an example of the manufacturing method of a semiconductor integrated circuit according to an embodiment of the present invention in the order of steps.

Next after the resist pattern RP16 is removed, as shown in FIG. 31, with the resist pattern RP17 as a mask, p-type impurity, for example, boron fluoride is ion-implanted into the n-well 7 in the PMOS formation region of the region B so as to form p-type diffusion region 16b in the n-well 7 on both sides of the gate electrode 15p. Subsequently, by ion-implanting n-type impurity, for example, phosphorus, halo layer is formed. The aforementioned boron fluoride is implanted in a condition that the implantation energy is 2 to 3 keV and the dose amount is $1 \times 10^{15}$ cm$^{-2}$ and the aforementioned phosphorus is implanted in a condition that the implantation energy is 55 keV and the dose amount is $1 \times 10^{13}$ cm$^{-2}$.

Figure 32:
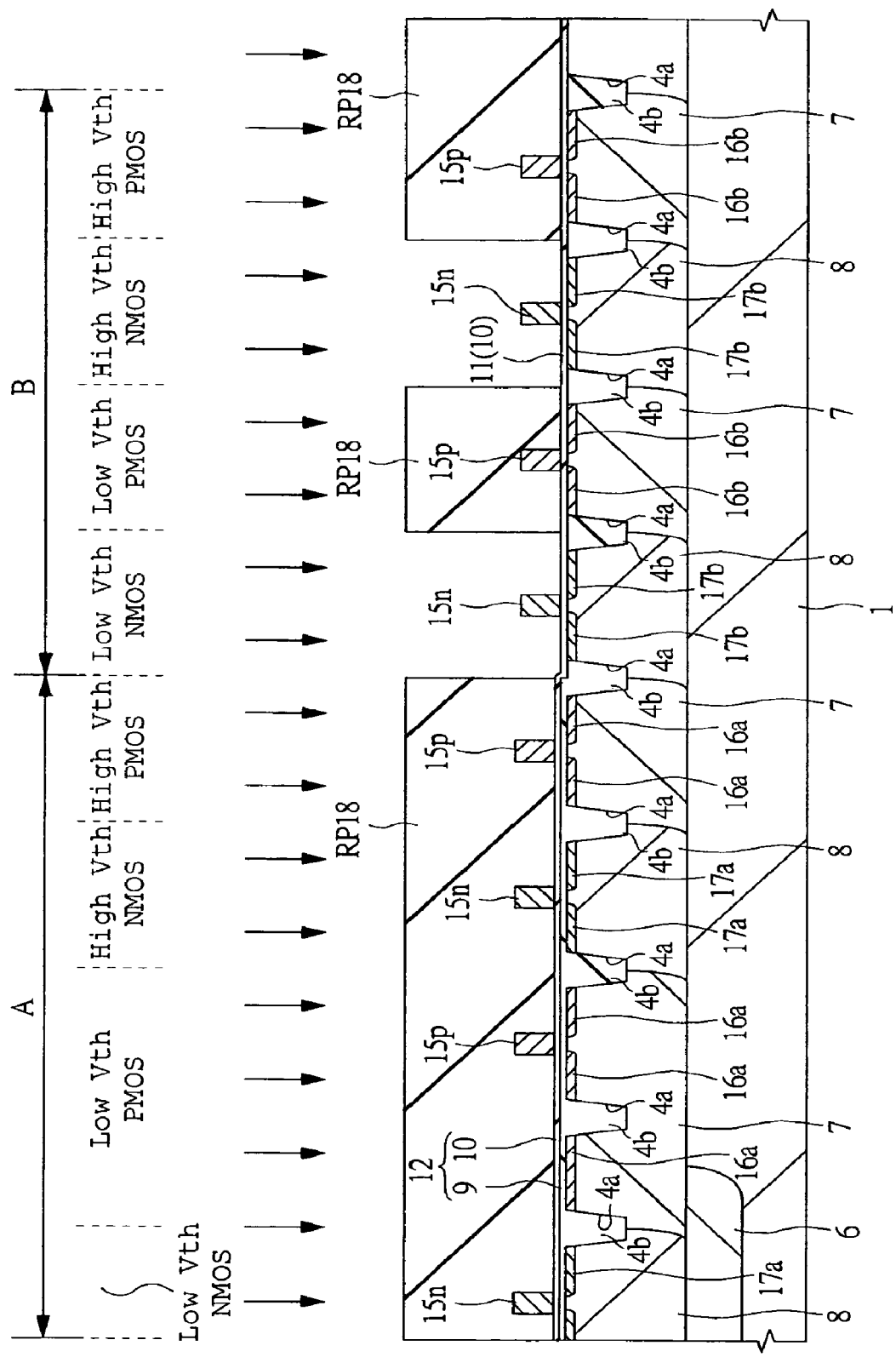
FIG. 32 is a major part sectional view of a semiconductor substrate showing an example of the manufacturing method of a semiconductor integrated circuit according to an embodiment of the present invention in the order of steps.

Next, after the resist pattern RP17 is removed, as shown in FIG. 32, with resist pattern RP18 as a mask, n-type impurity, for example, arsenic is ion-implanted into the p-well 8 in the NMOS formation region of the region B so as to form n-type diffusion region 17b on both sides of the gate electrode 15n. Subsequently, p-type impurity, for example, boron is ion-implanted to form halo layer. The aforementioned arsenic is implanted in a condition that the implantation energy is 3 keV and the dose amount is $2 \times 10^{15}$ cm$^{-2}$ and the aforementioned boron is implanted in a condition that the implantation energy is 55 keV and the dose amount is $1 \times 10^{13}$ cm$^{-2}$.

Figure 33:
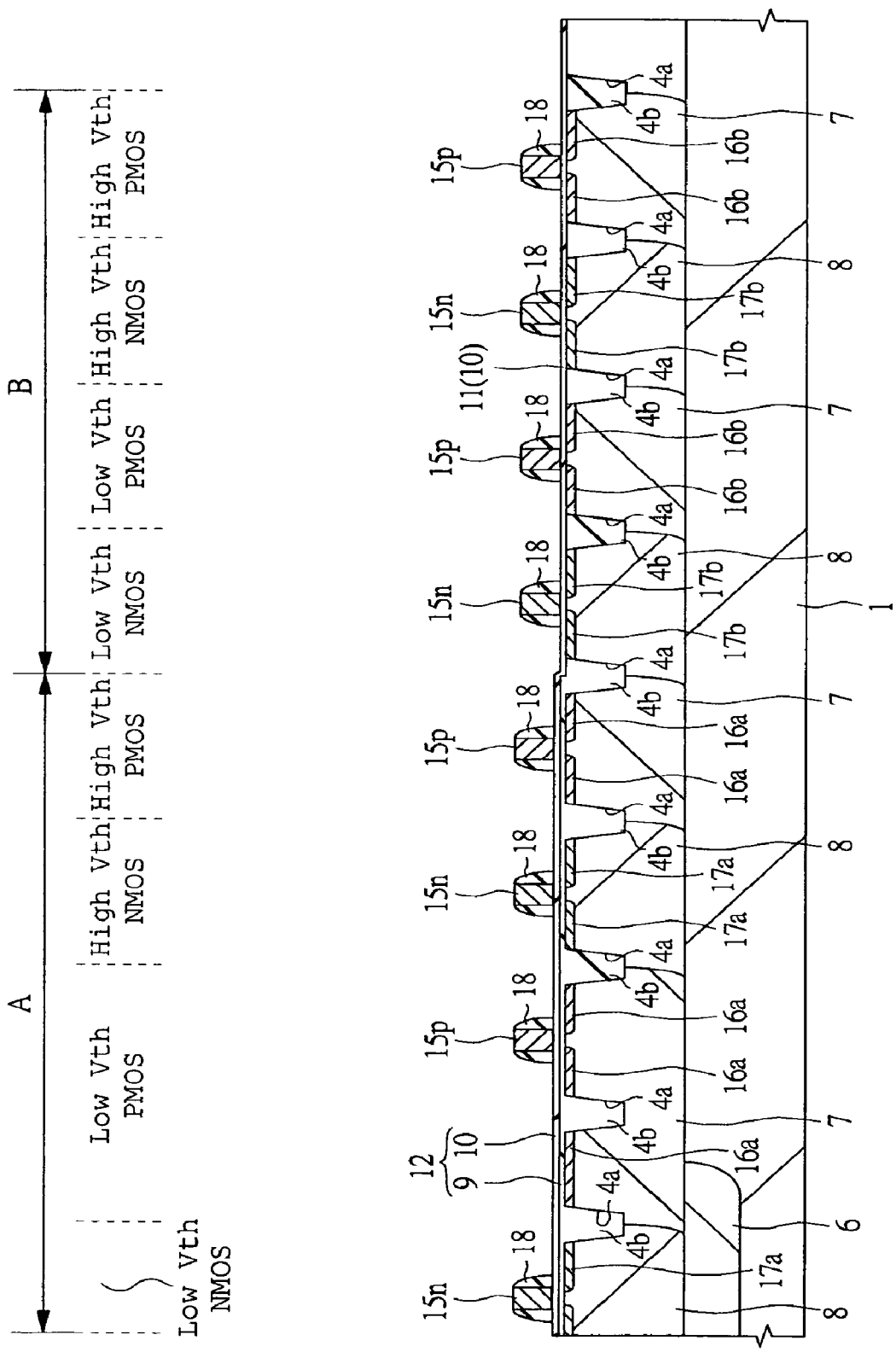
FIG. 33 is a major part sectional view of a semiconductor substrate showing an example of the manufacturing method of a semiconductor integrated circuit according to an embodiment of the present invention in the order of steps.

Next, after the resist pattern RP18 is removed, as shown in FIG. 33, silicon oxide film is deposited on the semiconductor substrate 1 according to the CVD method and subsequently, by anisotropic etching the silicon oxide film, side walls (side wall insulation films) 18 are formed on side walls of the gate electrodes 15n, 15p. Because the anisotropic etching makes the high dielectric constant insulation film 10 function as an etching stopper layer, damage to the semiconductor substrate 1 can be prevented.

Figure 34:
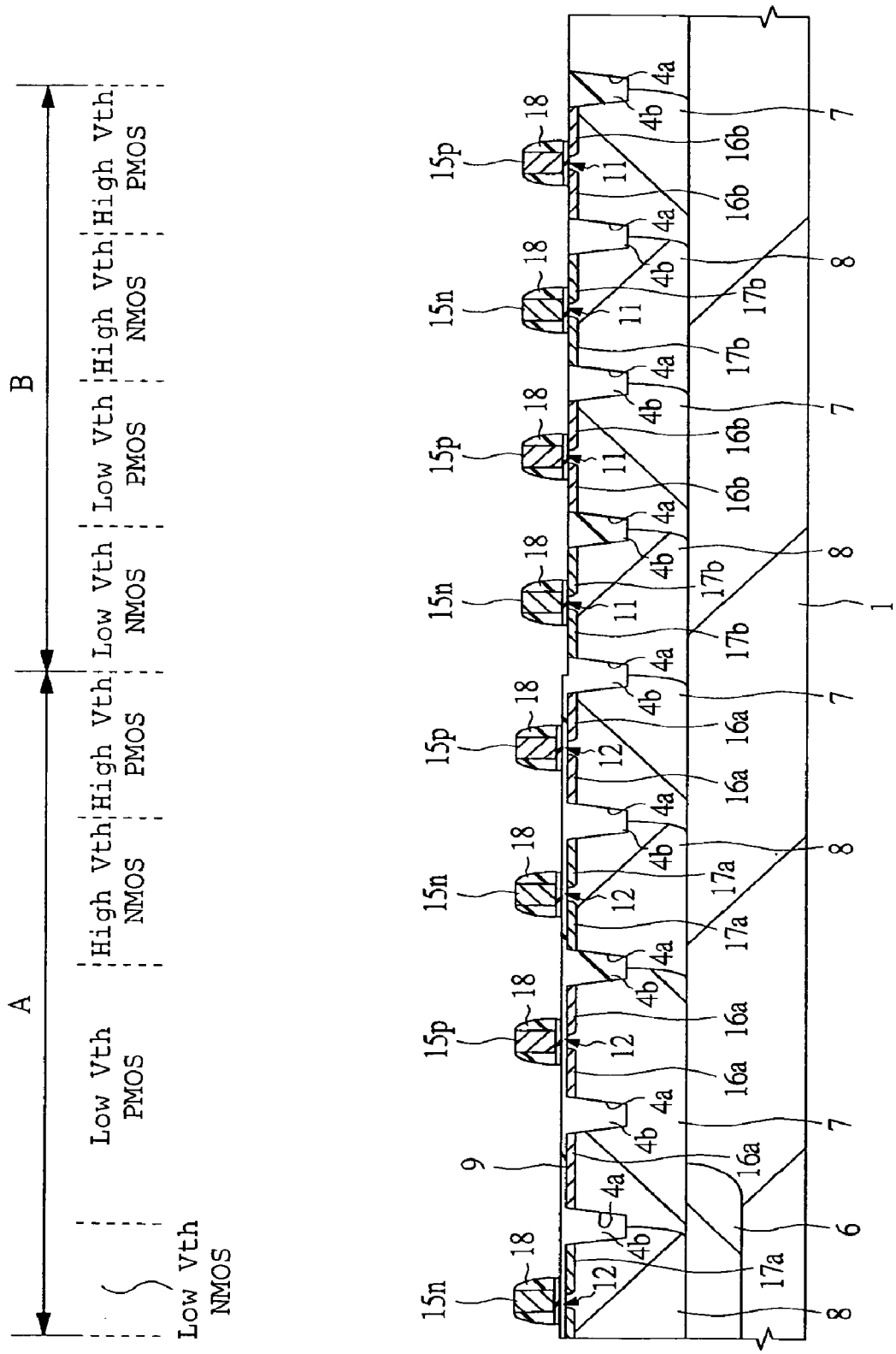
FIG. 34 is a major part sectional view of a semiconductor substrate showing an example of the manufacturing method of a semiconductor integrated circuit according to an embodiment of the present invention in the order of steps.
Figure 35:
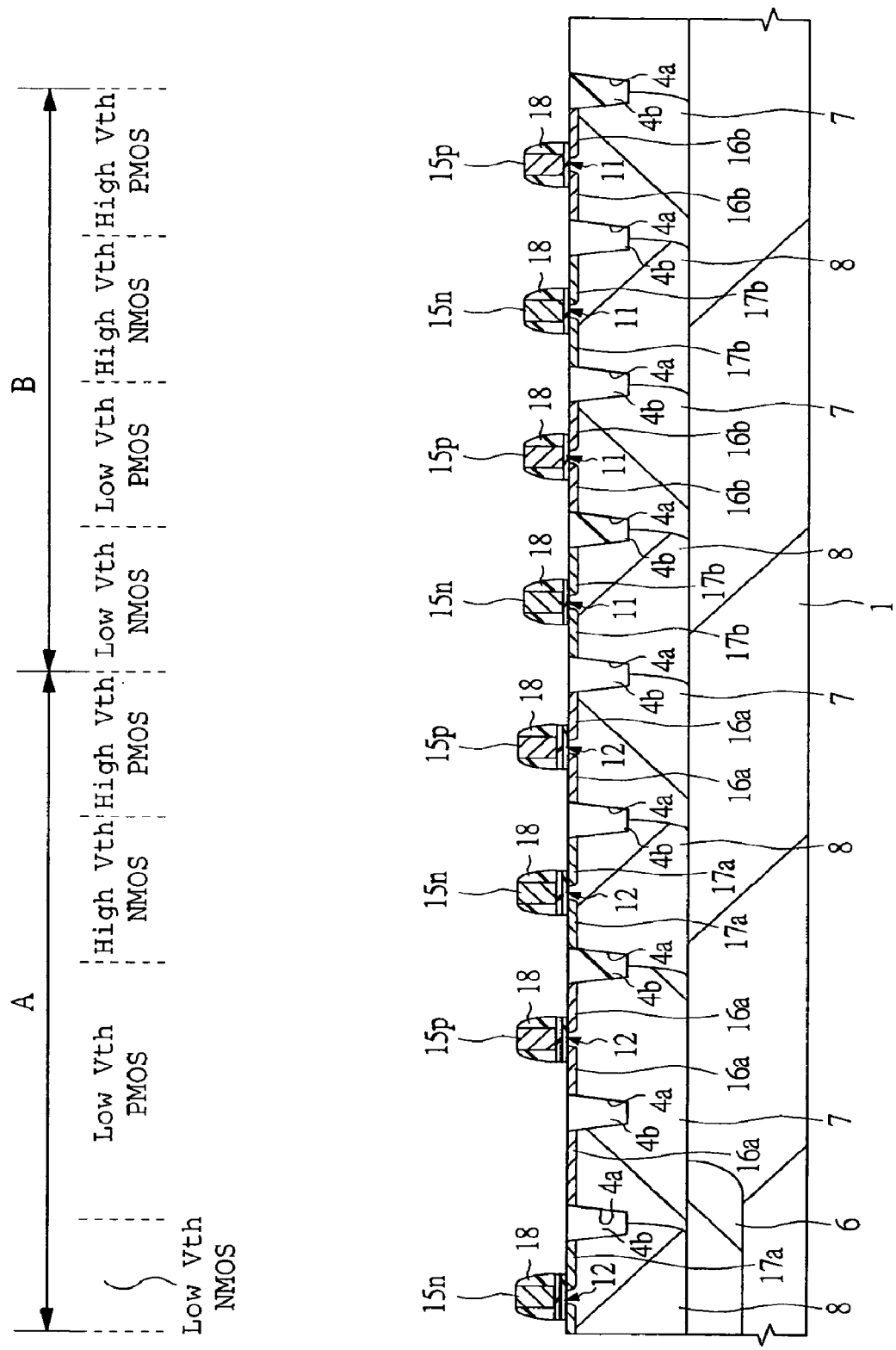
FIG. 35 is a major part sectional view of a semiconductor substrate showing an example of the manufacturing method of a semiconductor integrated circuit according to an embodiment of the present invention in the order of steps.

Next, as shown in FIG. 34, the high dielectric constant insulation film 10 exposed in a region surrounded by the side wall 18 and the isolation region is removed by spatter etching. Subsequently, as shown in FIG. 35, the silicon oxide film 9 exposed in a region surrounded by the side wall 18 and the isolation region in the region A is removed with wet etching.

Figure 36:
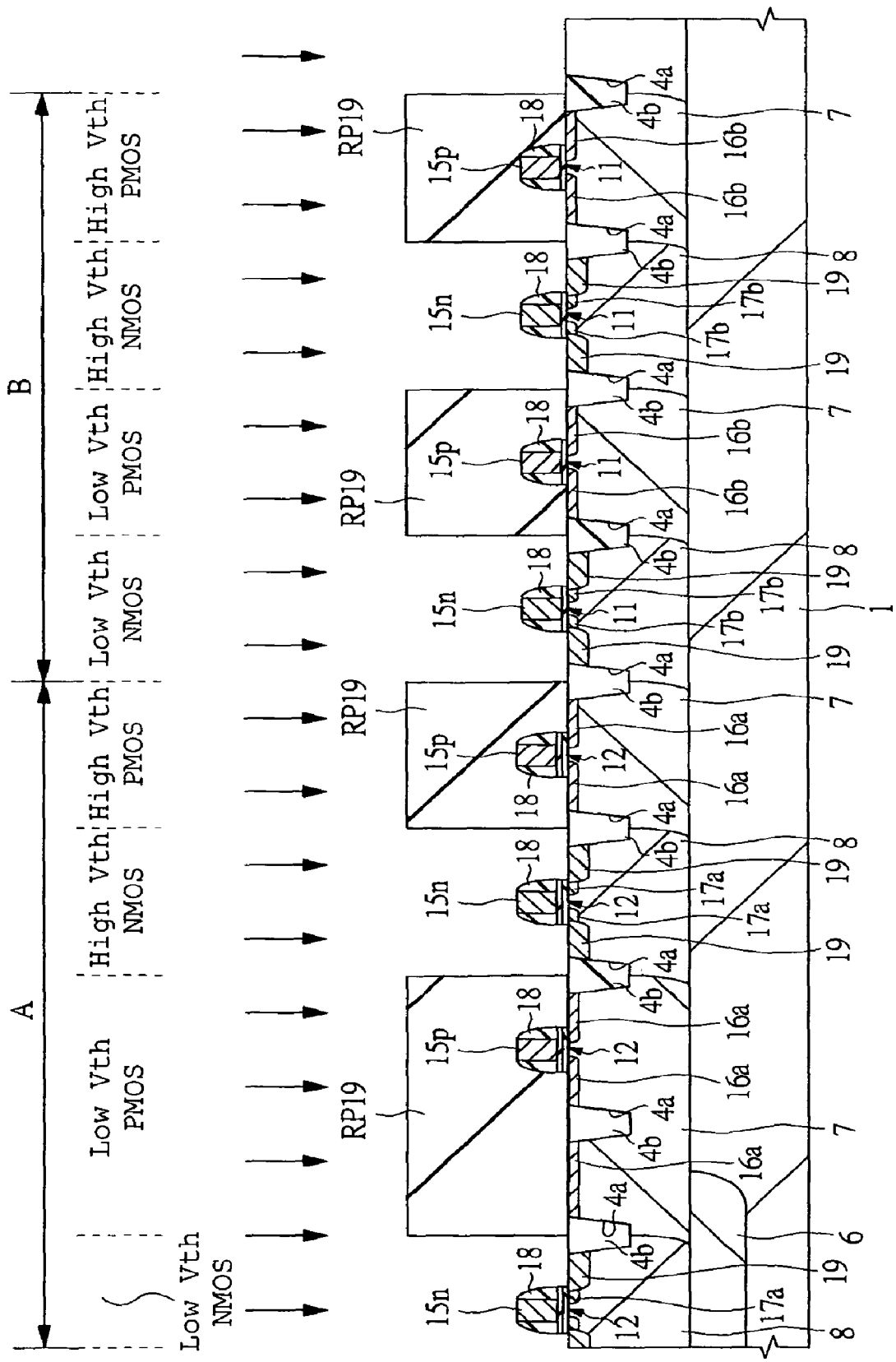
FIG. 36 is a major part sectional view of a semiconductor substrate showing an example of the manufacturing method of a semiconductor integrated circuit according to an embodiment of the present invention in the order of steps.

Next, as shown in FIG. 36, with resist pattern RP19 as a mask, n-type impurity, for example, arsenic is ion-implanted into the p-well 8 in the NMOS formation region in the regions A, B so as to form n-type diffusion region 19 in the p-well 8 on both sides of the gate electrode 15n. The n-type diffusion region 19 is formed by self-matching to the gate electrode 15n and the side wall 18, so that it functions as a source and drain of the n-channel MIS transistor.

Figure 37:
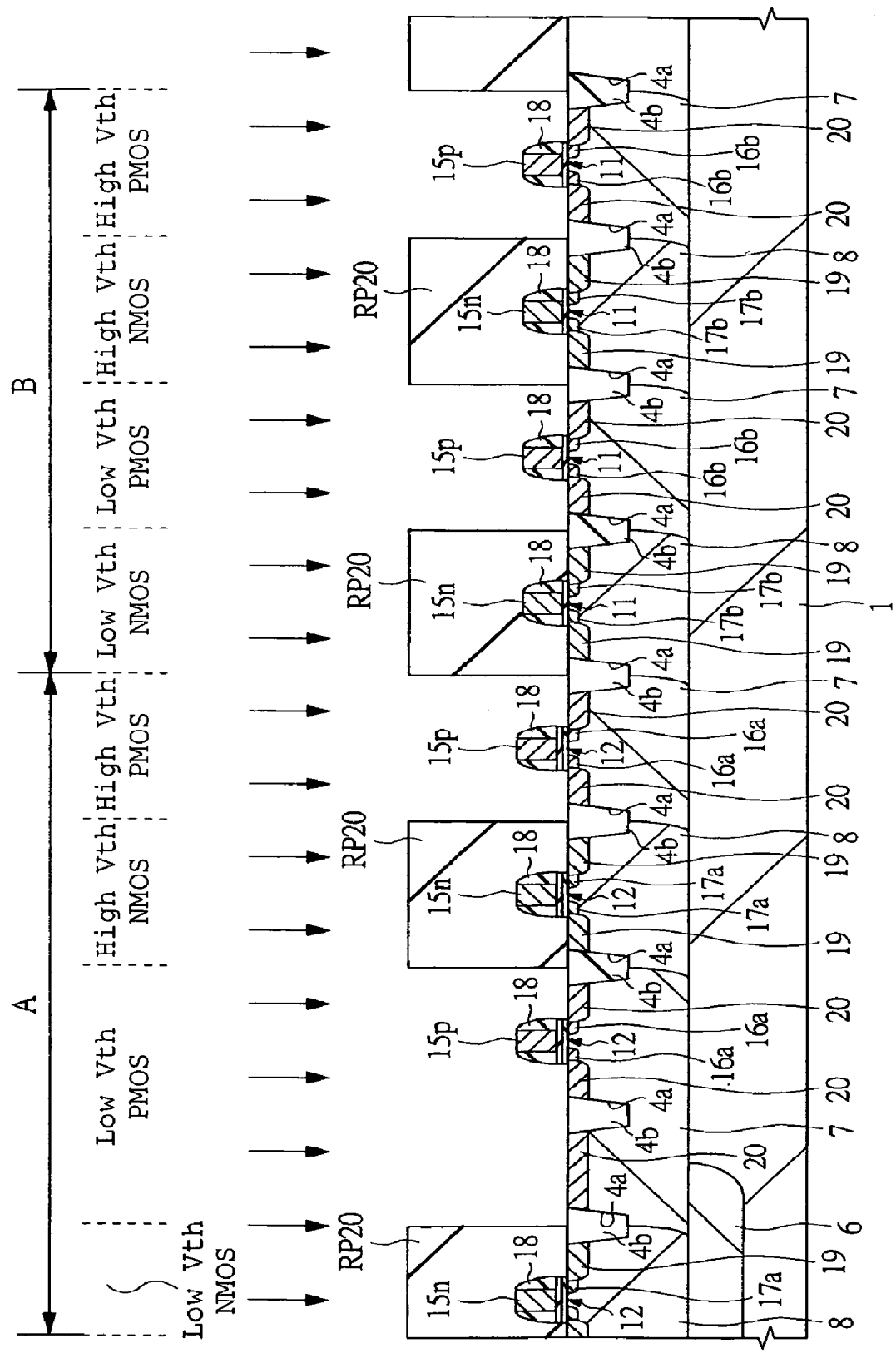
FIG. 37 is a major part sectional view of a semiconductor substrate showing an example of the manufacturing method of a semiconductor integrated circuit according to an embodiment of the present invention in the order of steps.

Next, after the resist pattern RP19 is removed, as shown in FIG. 37, with resist pattern RP20 as a mask, p-type impurity, for example, boron fluoride is ion-implanted into the n-well 7 in the PMOS formation regions of the regions A, B so as to form p-type diffusion region 20 in the n-well 9 on both sides of the gate electrode 15p. The p-type diffusion region 20 is formed by self-matching to the gate electrode 15p and the side wall 18 so that it functions as a source and drain of the p-channel MIS transistor.

Figure 38:
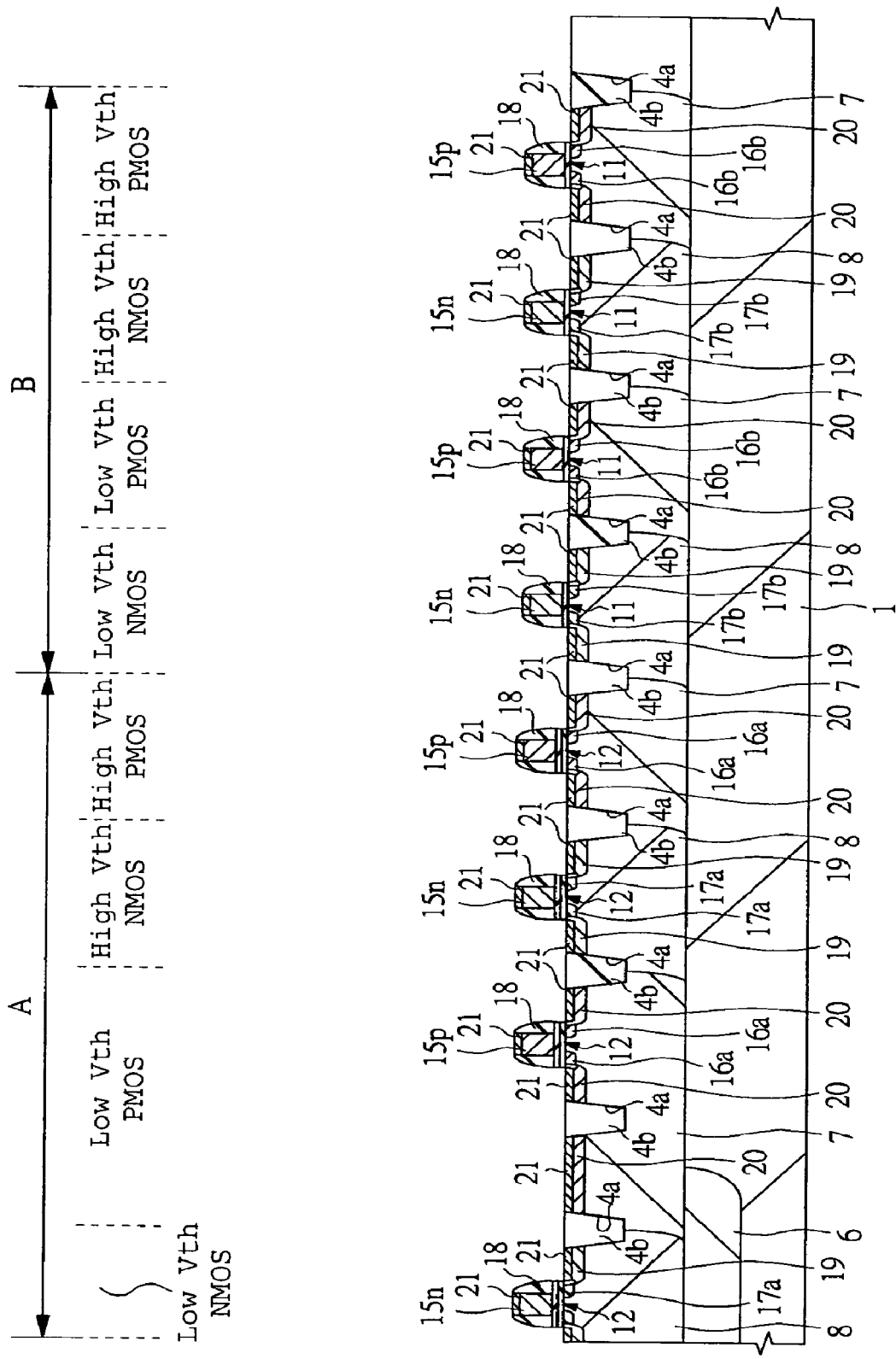
FIG. 38 is a major part sectional view of a semiconductor substrate showing an example of the manufacturing method of a semiconductor integrated circuit according to an embodiment of the present invention in the order of steps.

Next, after the resist pattern RP20 is removed, as shown in FIG. 38, refractory metal film, for example, cobalt film about 10 to 20 nm in thickness is deposited on the semiconductor substrate 1 according to for example, spattering method. Next, by performing heat treatment on the semiconductor substrate 1 at about 500 to 600° C., silicide layer 21 is formed in the thickness of about 30 nm and with a resistivity of 4 Ωcm on the surface of the gate electrode 15n of the n-channel MIS transistor and the surface of the n-type diffusion region 19 and the surface of the gate electrode 15p of the p-channel MIS transistor and the surface of the p-type diffusion region 20 selectively. After that, unreacted cobalt layer is removed with wet etching and heat treatment at about 700 to 800° C. is performed on the semiconductor substrate 1 in order to lower the resistance of the silicide layer 21.

Figure 39:
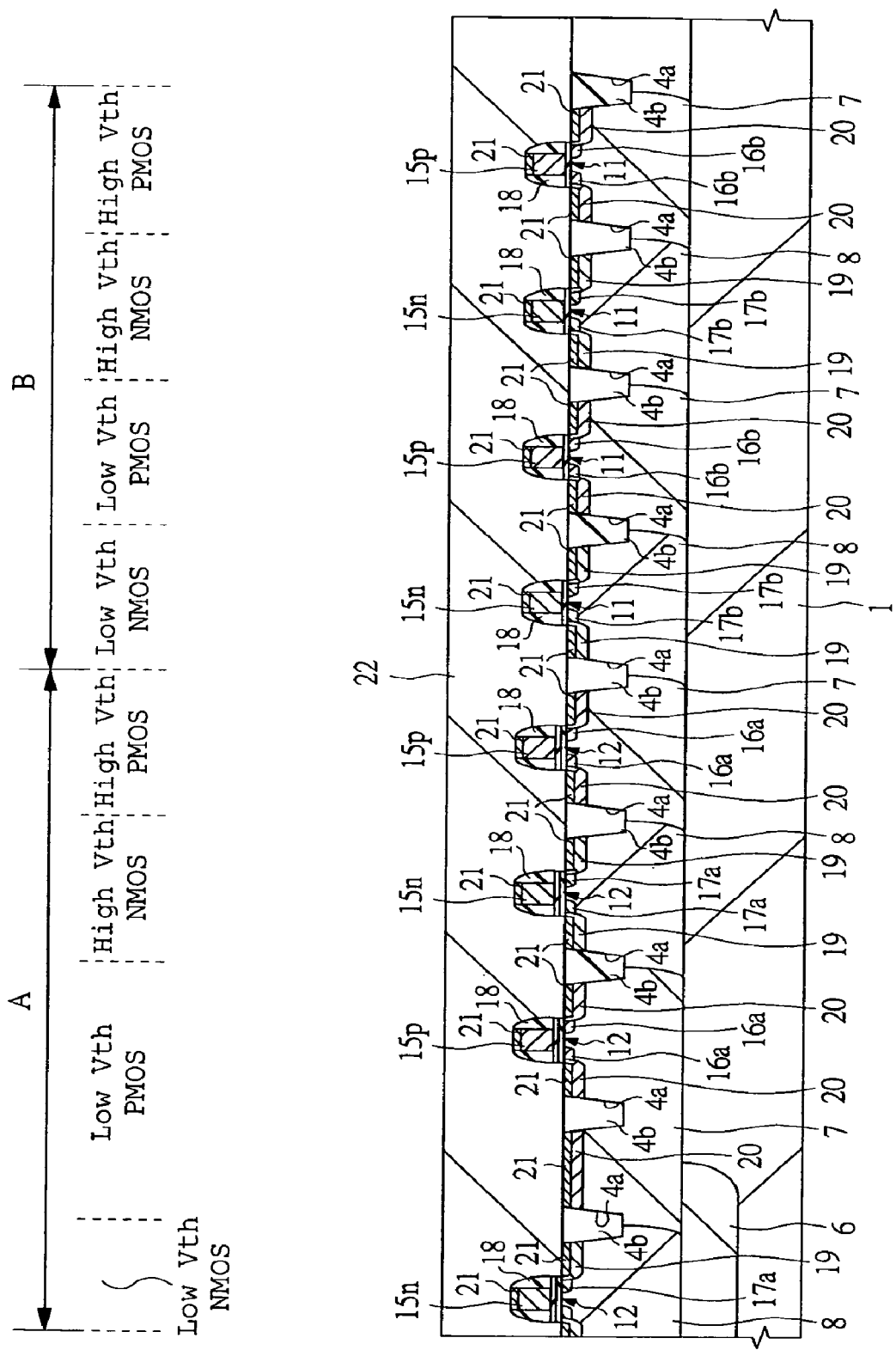
FIG. 39 is a major part sectional view of a semiconductor substrate showing an example of the manufacturing method of a semiconductor integrated circuit according to an embodiment of the present invention in the order of steps.

Next, after silicon oxide film 22 is formed on the semiconductor substrate 1 as shown in FIG. 39, that silicon oxide film 22 is polished according to, for example, the CMP method so as to flatten its surface. The silicon oxide film 22 is comprised of TEOS oxide film deposited according to plasma CVD method that TEOS (tetra ethyl ortho silicate: $Si(OC_2H_5)$) and ozone ($O_3$) are used as source gas.

Figure 40:
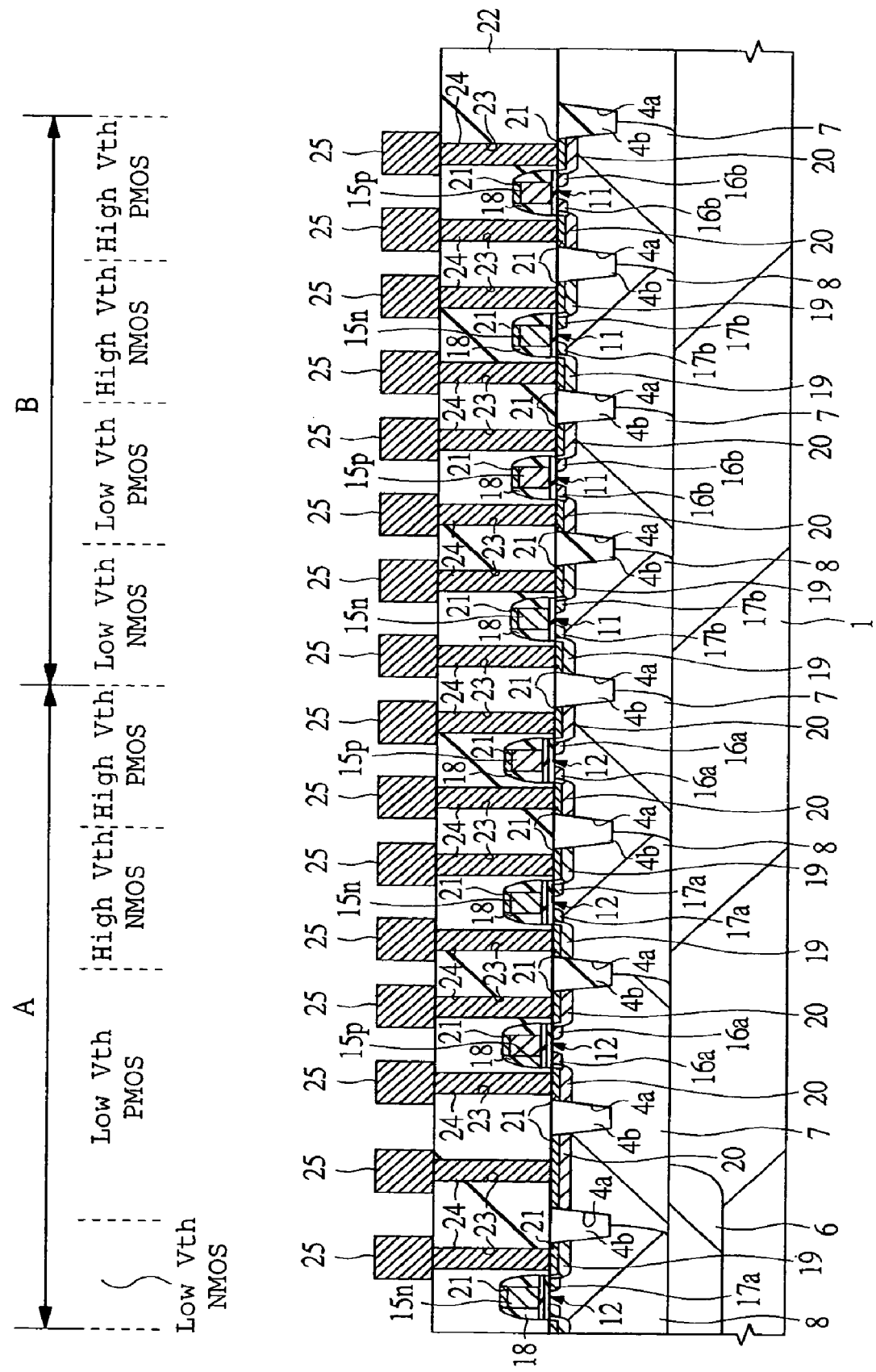
FIG. 40 is a major part sectional view of a semiconductor substrate showing an example of the manufacturing method of a semiconductor integrated circuit according to an embodiment of the present invention in the order of steps.

Next, as shown in FIG. 40, connecting holes 23 are formed in the silicon oxide film 22 by etching with the resist pattern as a mask. The connecting holes 23 are formed on necessary portions such as the n-type diffusion regions 19 and the p-type diffusion regions 20.

Next, titan nitride film is deposited on the entire surface of the semiconductor substrate 1 including the inside of the connecting holes 23, for example, according to the CVD method. Further, tungsten film for filling the connecting holes 23 is deposited, for example, according to the CVD method. After that, by removing the titan nitride film and tungsten film in other regions than the connecting holes 23, for example, according to the CMP method, a plug 24 is formed inside the connecting hole 23.

Subsequently, after the tungsten film is deposited on the semiconductor substrate 1, the tungsten film is processed by dry etching with the resist pattern as a mask so as to form wiring 25 of a first wiring layer. The tungsten film can be formed according to the CVD method or spattering method.

After this, by covering the entire surface of the semiconductor substrate 1 with passivation film, the semiconductor integrated circuit of an embodiment of the present invention is substantially completed.

As described above, according to this embodiment, after the silicon oxide film 9 is formed on the surface of the semiconductor substrate 1, the silicon oxide film 9 in the region B (region in which a gate insulation whose effective thickness is small is formed) is removed with diluted HF and after that, by forming high dielectric constant insulation film 10 on the semiconductor substrate 1, a damage or pollution to the surface of the semiconductor substrate 1 is prevented so as to form two kinds of the gate insulation films, that is, the gate insulation film 12 comprised of stacked film of the high dielectric constant insulation film 10 and the silicon oxide film 9 and the gate insulation film 11 comprised of the high dielectric constant insulation film 10 on the same semiconductor substrate 1.

Because the gate insulation film 12 in the region A is comprised of stacked film of the high dielectric constant insulation film 10 and the silicon oxide film 9, the difference in level between the region A and region B can be reduced compared to the stacked film comprised of two high dielectric constant insulation films.

Further because the thickness of the silicon oxide film 9 can be reduced as compared to a case where the gate insulation film 12 in the region A is comprised of only the silicon oxide film, oxidation of the interior of the isolation groove 4a can be suppressed so that stress at an end portion of the isolation groove 4a can be reduced.

Figure 41:
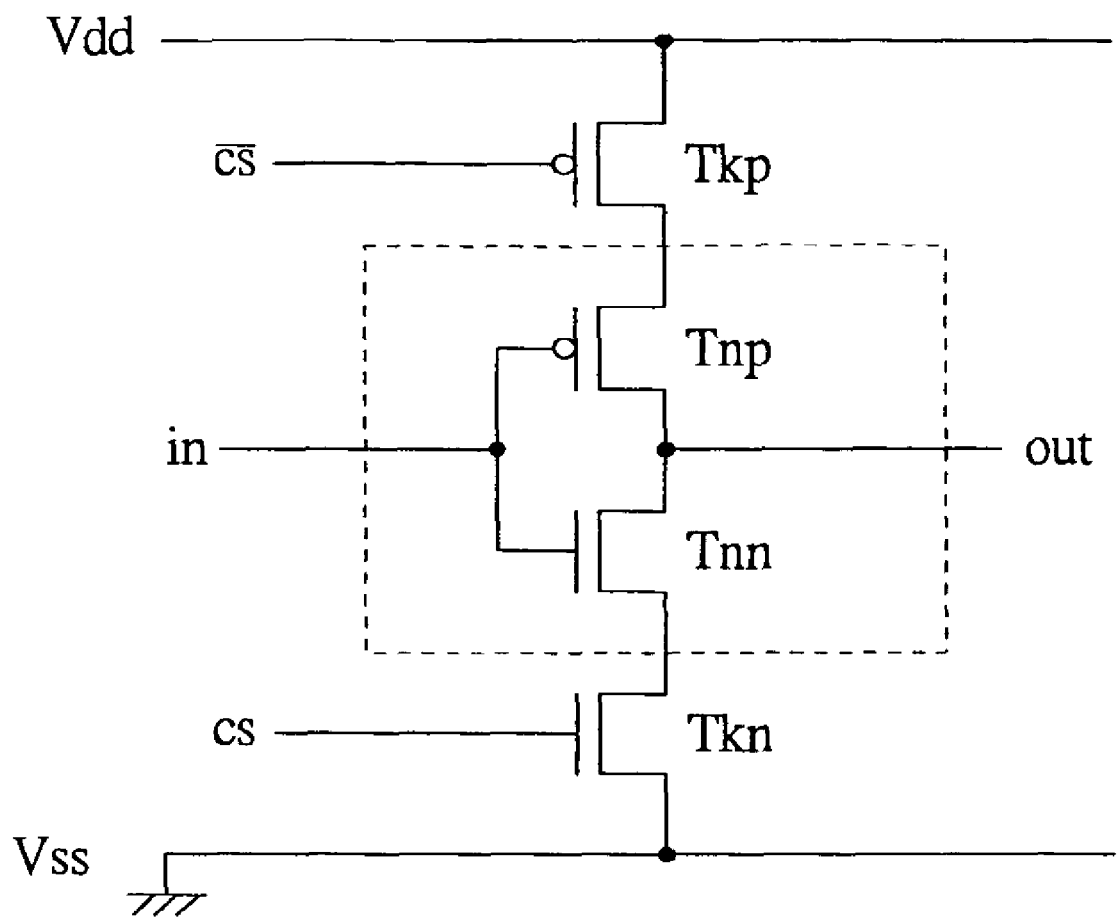
FIG. 41 is an equivalent circuit diagram showing an example of a CMOS inverter to which an embodiment of the present invention is applied.

Next, an example of an inverter circuit applying an embodiment of the present invention is shown in FIG. 41.

In the same Figure, a region surrounded by dotted lines indicates a CMOS inverter and Tkp and Tnp denote p-channel MIS transistor while Tkn and Tnn denote n-channel MIS transistor. The gate insulation film of the MIS transistors Tnp, Tnn constituting the CMOS inverter is thinner than the gate insulation film of the MIS transistors Tkp, Tkn. For example, the gate insulation film of the MIS transistors Tnp, Tnn constituting the CMOS inverter is formed of high dielectric constant insulation film and its effective thickness is about 3.5 nm. The gate insulation film of the MIS transistors Tkp, Tkn is constituted of stacked film of high dielectric constant insulation film and silicon oxide film and its effective thickness is about 6 nm.

The MIS transistors Tkp, Tkn whose gate insulation films are thick are inserted in between the CMOS inverter and a first power Vdd/a second power Vss. When processing a signal using this circuit (steady time), "H" is used as a control signal CS. With this signal, the MIS transistors Tkp, Tkn are turned ON so that the first power Vdd and the second power Vss are connected directly to the CMOS inverter.

When this circuit is not used, that is, at waiting time, 'L' is used as the control signal CS. At this time, the MIS transistors Tkp, Tkn are turned OFF, so that the first power Vdd and the second power Vss are separated from the CMOS inverter. A leakage current between the gate and source, and between the gate and drain of the MIS transistors Tnp, Tnn never flows between the first power Vdd and the second power Vss because the MIS transistors Tkp, Tkn are turned OFF. Although the CMOS inverter does not function as an inverter because no first power Vd or second power Vss is supplied, an increase in power consumption due to leakage current can be suppressed by the MIS transistors Tkp, Tkn.

Figure 42:
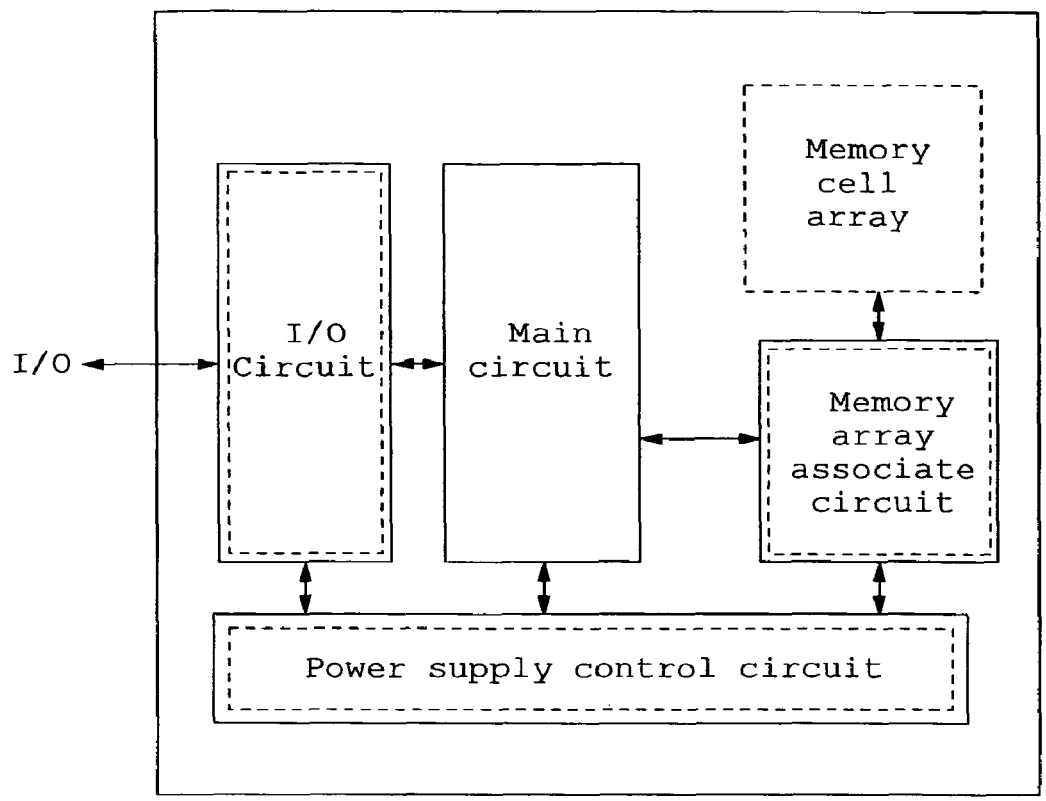
FIG. 42 is a circuit block diagram showing an example of an integrated circuit device to which an embodiment of the present invention is applied.

Next, an example of the integrated circuit device applying the embodiment of the present invention will be described with reference to a block diagram shown in FIG. 42. This Figure indicates a memory device with logic in which a memory circuit and a logic circuit are provided on a same substrate as an integrated circuit, and constituted of mainly a main circuit, I/O (input/output interface) circuit, memory array associate circuit, memory cell array and power supply control circuit.

The main circuit (indicated by surrounding its circuit block with a solid line) is constituted of the MIS transistor employing mainly thin gate insulation film in terms of area ratio in an activate region of the MIS transistor. The I/O circuit, the memory array associate circuit and the power control circuit (its circuit block is indicated by surrounding with a solid line and dotted line) are constituted of MIS transistor using a thin gate insulation film and MIS transistor using a thick gate insulation film. The memory cell array (its circuit block is indicated by surrounding with dotted line) is constituted of MIS transistor using a thick gate insulation film. The thin gate insulation film mentioned here refers to an insulation film (having the same structure as the aforementioned gate insulation film 11) comprised of high dielectric constant insulation film. The thick gate insulation film mentioned here refers to stacked insulation film (having the same structure as the gate insulation film 12) comprised of high dielectric constant insulation film and silicon oxide film.

The main circuit is constituted of CPU (central processing unit) and the like so as to exchange input and output signals with outside through, for example, an I/O circuit. Further, signals are exchanged with the memory cell through the memory array associate circuit. Because a number of logic devices are included and a high speed operation is demanded, the main circuit is occupied mostly by the MIS transistor using the thin gate insulation film.

Figure 43:
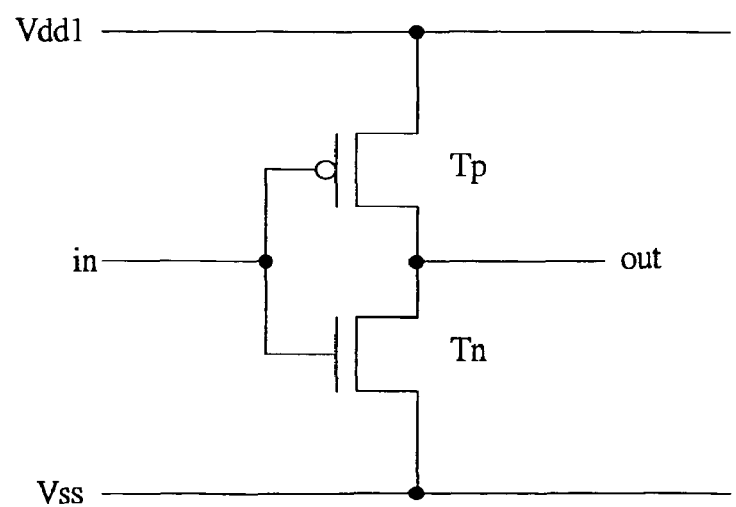
FIG. 43 is an equivalent circuit diagram showing an example of an inverter using a thick gate insulation film in an I/O circuit.

FIG. 43 shows an example of an equivalent circuit in an inverter using the thin gate insulation film in the main circuit. A power Vdd1 of a relatively low voltage is connected to the main circuit.

Although the I/O circuit, the memory array associate circuit and power control circuit are comprised of mainly a MIS transistor using a thin gate insulation film, the MIS transistor using a thick gate insulation film is used as a switch MIS transistor to a power supply. Further, the MIS transistor using the thick gate insulation film is used for a portion to which a large signal is applied directly from outside of the I/O circuit.

Figure 44:
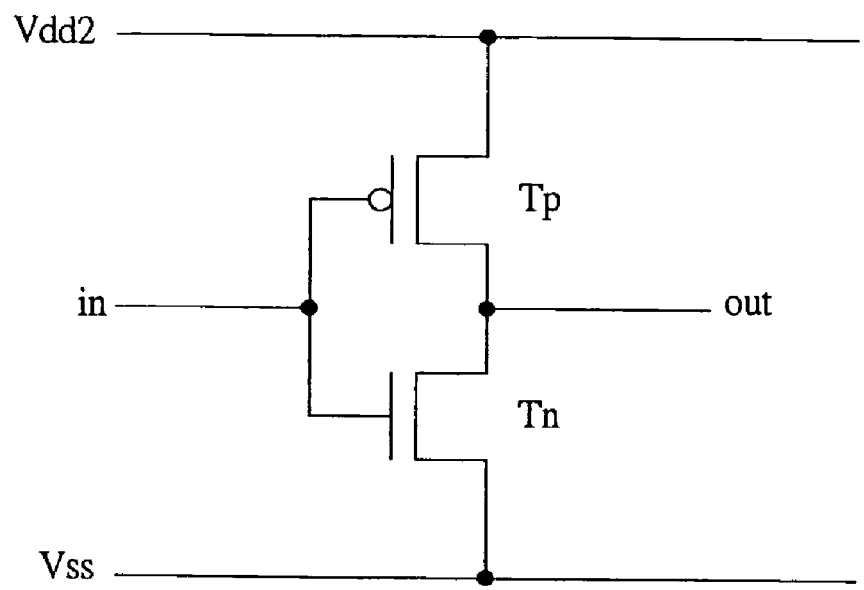
FIG. 44 is an equivalent circuit diagram showing an example of an inverter using a thin gate insulation film in its main circuit.

FIG. 44 shows an example of an equivalent circuit of an inverter using a thick gate insulation film in an I/O circuit. The power Vdd2 having a relatively high voltage is connected to the I/O circuit.

A MIS transistor in which a thick gate insulation film is used for its memory cell is used for the memory cell array because its memory information is deleted if the leakage current is large.

Figure 45:
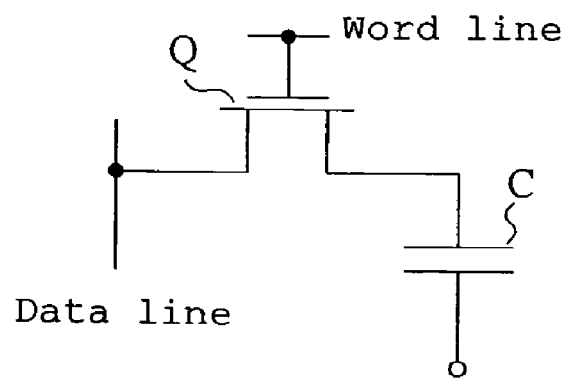
FIG. 45 is an equivalent circuit diagram showing an example of a memory cell which constitutes a memory cell array.

FIG. 45 shows an example of a memory cell constituting the memory cell array. The indicated memory cell is a DRAM (dynamic random access memory) cell, which is comprised of a selective MIS transistor Q serving as a switch and a capacitor C for accumulating information charge. A MIS transistor using a thick gate insulation film is used for the selective MIS transistor Q.

Such a circuit demanded to operate rapidly employs a thin gate insulation film for its MIS transistor because a performance corresponding to a trend of increased speed of the MIS transistor is demanded. On the other hand, a circuit demanded to high match with a power or a memory cell in which a reduction in leakage current is demanded employ a thick gate insulation film for its MIS transistor.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although in the above-described embodiment, the high dielectric constant insulation film is regarded as alumina film, the present invention is not restricted to this example, but this high dielectric constant insulation film may be comprised of titanic oxide film ($TiO_x$), zirconium oxide film ($ZrO_x$), hafnium oxide film ($HfO_x$), tantalum oxide film ($TaO_x$) or ruthenium oxide film ($RuO_x$).

INDUSTRIAL APPLICABILITY

Because the gate insulation film comprised of stacked film of high dielectric constant insulation film and silicon oxide film and the gate insulation film comprised of the high dielectric constant insulation film can be formed on the same semiconductor substrate so as to suppress damage or pollution to the surface of the semiconductor substrate, plural gate insulation films each having a different thickness and a high reliability can be formed. Further, because the gate insulation film having a high effective thickness is constituted of stacked film of the high dielectric constant insulation film and silicon oxide film, a difference in step between a region in which the gate insulation film having a large effective thickness is formed and a region in which the gate insulation film having a small effective thickness is decreased as compared to a stacked film in which two high dielectric constant insulation films are stacked, so that subsequent manufacturing of the MIS transistor is facilitated.

The invention claimed is:

1. A semiconductor integrated circuit device comprising:
a first MISFET for use as a selecting MISFET of a dynamic random access memory cell and formed in a first region of a semiconductor substrate; and
a second MISFET formed in a second region of the semiconductor substrate,
wherein the first MISFET includes:
a first insulation film formed over the first region;
a first portion of a third insulation film formed over the first insulation film;
a first gate electrode of the first MISFET formed over the first portion of the third insulation film,
wherein the second MISFET includes:
a second insulation film formed over the second region;
a second portion of the third insulation film formed over the second insulation film;
a second gate electrode of the second MISFET formed over the second portion of the third insulation film,
wherein the first and second portions of the third insulation film of the first and second MISFETs, respectively, are formed as a same layer,
wherein the first and second insulation films include silicon, oxygen, and nitrogen,
wherein the first and second portions of the third insulation film of the first and second MISFETs, respectively, have a greater dielectric constant than each of the first and second insulation films,
wherein a thickness of the first insulation film is larger than a thickness of the second insulation film, and
wherein thicknesses of the first and second portions of the third insulation film of the first and second MISFETs, respectively, are larger than the thicknesses of the first insulation film and the second insulation film, respectively.

2. A semiconductor integrated circuit device according to claim 1, wherein the first insulation film is a silicon oxynitride film.

3. A semiconductor integrated circuit device according to claim 1, wherein the second insulation film is a silicon oxynitride film.

4. A semiconductor integrated circuit device according to claim 1, wherein the third insulation film is a hafnium oxide film.

5. A semiconductor integrated circuit device according to claim 1, wherein the first and second MISFETs further comprise:
impurity extension regions of a first conductivity type formed in the semiconductor substrate on both sides of the first and second gate electrodes in the first and the second regions, respectively;
sidewalls formed over both sides of the first and second gate electrodes; and
impurity diffusion regions of the first conductivity type formed in the semiconductor substrate on both sides of the sidewalls in the first and the second regions.

6. A semiconductor integrated circuit device according to claim 5, wherein the first and second MISFETs further comprise:
silicide layers formed over the first gate electrode, the second gate electrode, and the impurity diffusion regions.

7. A semiconductor integrated circuit device according to claim 6, wherein the silicide layers include cobalt.

8. A semiconductor integrated circuit device according to claim 5, wherein the first and second MISFETs further comprise:
halo layers of a second conductivity type formed in the semiconductor substrate on both sides of the first and second gate electrodes in the first and the second regions, respectively.

9. A semiconductor integrated circuit device according to claim 8,
wherein the first conductivity type is p-type; and
wherein the second conductivity type is n-type.

10. A semiconductor integrated circuit device according to claim 8,
wherein the first conductivity type is n-type; and
wherein the second conductivity type is p-type.

11. A semiconductor integrated circuit device comprising:
a first MISFET for use as a selecting MISFET of a dynamic random access memory cell and formed in a first region of a semiconductor substrate;
a second MISFET formed in a second region of the semiconductor substrate; and
a third MISFET formed in a third region of the semiconductor substrate,
wherein the first MISFET includes:
a first portion of a first insulation film formed over the first region;
a first portion of a third insulation film formed over the first portion of the first insulation film of the first MISFET;
a first gate electrode formed over the first portion of the third insulation film of the first MISFET;
wherein the second MISFET includes:
a second insulation film formed over the second region;
a second portion of the third insulation film formed over the second insulation film;
a second gate electrode formed over the second portion of the third insulation film of the second MISFET;
wherein the third MISFET includes:

a second portion of the first insulation film formed over the first region;

a third portion of the third insulation film formed over the second portion of the first insulation film of the third MISFET;

a third gate electrode formed over the third portion of the third insulation film of the third MISFET, wherein the first, second, and third portions of the third insulation film of the first, second, and third MISFETs, respectively, are formed as a same layer, wherein the first and second insulation films include silicon, oxygen, and nitrogen;

wherein the first, second, and third portions of the third insulation film of the first, second, and third MISFETs, respectively, have a greater dielectric constant than each of the first and second insulation films, wherein thicknesses of the first and second portions of the first insulation film of the first and third MISFETs, respectively, are larger than a thickness of the second insulation film, and wherein thicknesses of the first, second, and third portions of the third insulation film of the first, second, and third MISFETs, respectively, are larger than the thicknesses of the first and second portions of the first insulation film and the thickness of the second insulation film.

12. A semiconductor integrated circuit device according to claim 11, wherein the first insulation film is a silicon oxynitride film.

13. A semiconductor integrated circuit device according to claim 11, wherein the second insulation film is a silicon oxynitride film.

14. A semiconductor integrated circuit device according to claim 11, wherein the third insulation film is a hafnium oxide film.

15. A semiconductor integrated circuit device according to claim 11, wherein the first, second, and third MISFETs further comprise:

impurity extension regions of a first conductivity type formed in the semiconductor substrate on both sides of the first, second, and third gate electrodes in the first and the second regions;

sidewalls formed over both sides of the first, second, and third gate electrodes, and impurity diffusion regions of the first conductivity type formed in the semiconductor substrate on both sides of the sidewalls in the first and the second regions.

16. A semiconductor integrated circuit device according to claim 15, wherein the first, second, and third MISFETs further comprise:

silicide layers formed over the first gate electrode, the second gate electrode, the third gate electrode, and the impurity diffusion regions.

17. A semiconductor integrated circuit device according to claim 16, wherein the silicide layers include cobalt.

18. A semiconductor integrated circuit device according to claim 15, wherein the first, second, and third MISFETs further comprise:

halo layers of a second conductivity type formed in the semiconductor substrate.

19. A semiconductor integrated circuit device according to claim 18, wherein the first conductivity type is p-type, and wherein the second conductivity type is n-type.

20. Semiconductor integrated circuit device according to claim 18, wherein the first conductivity type is n-type, and wherein the second conductivity type is p-type.

* * * * *